(12) United States Patent
Nakayama et al.

(10) Patent No.: US 10,134,908 B2
(45) Date of Patent: Nov. 20, 2018

(54) SEMICONDUCTOR DEVICE AND MANUFACTURING METHOD THEREOF

(71) Applicant: Renesas Electronics Corporation, Tokyo (JP)

(72) Inventors: Tatsuo Nakayama, Ibaraki (JP); Hironobu Miyamoto, Ibaraki (JP); Yasuhiro Okamoto, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/363,386

(22) Filed: Nov. 29, 2016

(65) Prior Publication Data
US 2017/0186880 A1   Jun. 29, 2017

(30) Foreign Application Priority Data
Dec. 25, 2015  (JP) ................. 2015-253628

(51) Int. Cl.
| | |
|---|---|
| H01L 29/786 | (2006.01) |
| H01L 21/30 | (2006.01) |
| H01L 29/20 | (2006.01) |
| H01L 29/66 | (2006.01) |

(52) U.S. Cl.
CPC .... *H01L 29/78681* (2013.01); *H01L 21/3006* (2013.01); *H01L 29/2003* (2013.01); *H01L 29/66522* (2013.01)

(58) Field of Classification Search
CPC ................................................ H01L 21/2258
See application file for complete search history.

(56) References Cited

U.S. PATENT DOCUMENTS

2007/0108452 A1* 5/2007 Kauer ............... H01L 21/02389
257/84

FOREIGN PATENT DOCUMENTS

JP       2011-210780 A     10/2011

\* cited by examiner

*Primary Examiner* — Marcos D Pizarro
*Assistant Examiner* — Antonio Crite
(74) *Attorney, Agent, or Firm* — Sughrue Mion, PLLC

(57) ABSTRACT

A MISFET is formed to include: a co-doped layer that is formed over a substrate and has an n-type semiconductor region and a p-type semiconductor region; and a gate electrode formed over the co-doped layer via a gate insulation film. The co-doped layer contains a larger amount of Mg, a p-type impurity, than that of Si, an n-type impurity. Accordingly, the carriers (electrons) resulting from the n-type impurities (herein, Si) in the co-doped layer are canceled by the carriers (holes) resulting from p-type impurities (herein, Mg), thereby allowing the co-doped layer to serve as the p-type semiconductor region. Mg can be inactivated by introducing of hydrogen into, of the co-doped layer, a region where the n-type semiconductor region is to be formed, thereby allowing the region to serve as the n-type semiconductor region. By thus introducing hydrogen into the co-doped layer, the p-type semiconductor region and the n-type semiconductor region can be formed in the same layer.

6 Claims, 13 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2015-253628 filed on Dec. 25, 2015 including the specification, drawings and abstract is incorporated herein by reference in its entirety.

BACKGROUND

The present invention relates to a semiconductor device, and can be preferably used in a semiconductor device using, for example, a nitride semiconductor.

In recent years, semiconductor devices using a group III-V compound having a larger bandgap than silicon (Si), for example, gallium nitride (GaN), are drawing attention. A semiconductor element has a p-type impurity region and an n-type impurity region. For example, an n-type MISFET has a source region and a drain region, each including an n-type impurity region, on both sides of a p-type impurity region that will serve as a channel region. The n-type MISFET has a constituent part (npn constituent part) including such an npn-type impurity region.

When a Si substrate is used, such an n-type or p-type impurity region can be easily formed by an ion implantation process. However, it is difficult to form a p-type impurity region over a GaN substrate or in a GaN layer epitaxially grown by an ion implantation process.

Accordingly, for example, in Patent Document 1 (Japanese Unexamined Patent Application Publication No. 2011-210780), an npn constituent part is formed by growing a p-GaN layer while being doped with p-type impurities by a metal organic chemical vapor deposition process or a molecular beam crystal growth process and then by implanting Si ions into the p-GaN layer to form an n$^+$-GaN region.

RELATED ART DOCUMENT

Patent Document

[Patent Document 1] Japanese Unexamined Patent Application Publication No. 2011-210780

SUMMARY

The present inventors are engaged in research and development of semiconductor devices using a nitride semiconductor as described above, and are studying hard to improve the properties thereof. Forming, for example, an np-type impurity region (np constituent part) in a layer including a group III-V compound, for example, in a GaN layer is not so easy as when a silicon substrate is used. The steps as described in the aforementioned Patent Document 1 can be used, but the characteristic of each region that has been formed is not sufficient. It has been found that, as described above, there is room for further improvement in a semiconductor device using a nitride semiconductor (in particular, np constituent part) and a manufacturing method thereof.

Other problems and new characteristics will become clear from the description and accompanying drawings of the present specification.

Of the preferred embodiments disclosed in the present application, outlines of the typical ones will be briefly described as follows.

A semiconductor device according to one embodiment disclosed in the present application has a nitride semiconductor layer that is formed over a substrate and has an n-type semiconductor region and a p-type semiconductor region, in which: the nitride semiconductor layer has p-type impurities and n-type impurities; and in the nitride semiconductor layer, the concentration of the p-type impurity is higher than that of the n-type impurity.

A manufacturing method of a semiconductor device according to one embodiment disclosed in the present application includes the steps of: (a) forming a nitride semiconductor layer having p-type impurities and n-type impurities over a substrate; and (b) introducing hydrogen into a first region of the nitride semiconductor layer, in which the first region is allowed to serve as an n-type semiconductor region by the step (b).

Advantage of the Invention

In a semiconductor device according to a typical embodiment that is disclosed in the present application and described below, the characteristic of the semiconductor device can be improved.

In a manufacturing method of a semiconductor device according to a typical embodiment that is disclosed in the present application and described below, a semiconductor device having a good characteristic can be manufactured.

DETAILED DESCRIPTION

Figure 1:
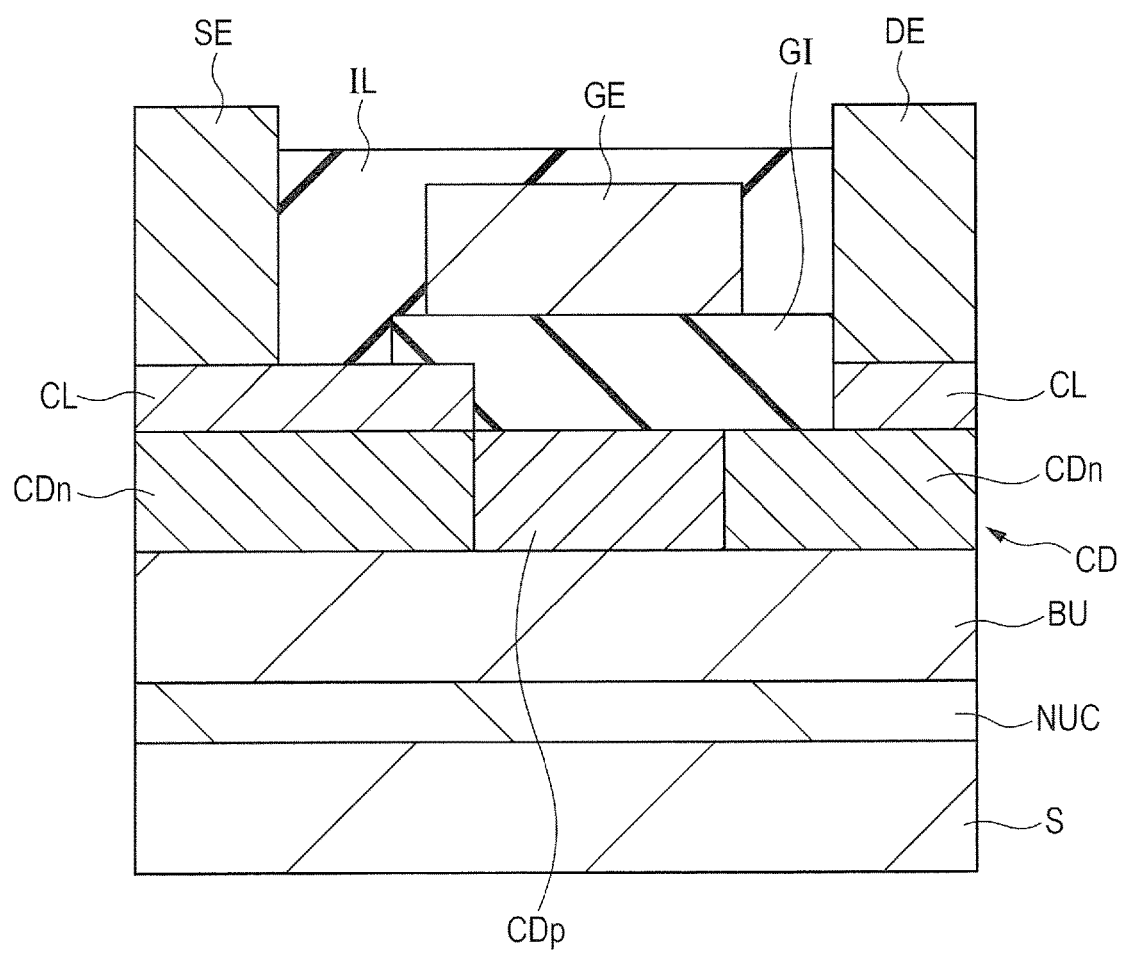
FIG. 1 is a sectional view illustrating a configuration of a semiconductor device according to First Embodiment.

If needed for convenience, the following embodiments will be described by dividing each of them into multiple sections or embodiments; however, the multiple sections or embodiments are not irrelevant to each other, but they are in a relationship in which one is a variation, application example, detailed description, or supplementary description of part or the whole of the others, unless otherwise indicated. When the numbers of elements, etc. (including numbers of pieces, numerical values, amounts, ranges, etc.) are referred to in the following embodiments, the numbers are not limited to the specific ones but may be more or less than the specific numbers, unless otherwise indicated or except when the numbers are obviously limited to the specific numbers in principle.

Further, in the following embodiments, the constituents (also including element steps, etc.) are not necessarily essential, unless otherwise indicated or clearly essential in principle. Similarly, when the shapes and positional relations, etc., of the constituents, etc., are referred to in the following embodiments, those substantially the same as or similar to the shapes, etc., should also be included, unless otherwise indicated or except when considered to be clearly otherwise in principle. The same is true with the aforementioned numbers, etc., (including the numbers of pieces, numerical values, amounts, and ranges, etc.).

Hereinafter, preferred embodiments will be described in detail with reference to the accompanying views. In the whole views for explaining the embodiments, members having the same function as each other will be denoted with the same or relevant reference numeral and duplicative description will be omitted. When a plurality of similar members (parts) are present, an individual or specific part may be represented by adding a sign to the collective reference numeral. In the following embodiments, description of the same or similar parts will not be repeated in principle, unless particularly necessary.

In the views used in the embodiments, hatching may be omitted even in sectional views in order to make them easier to see.

In the sectional views, the size of each part does not correspond to that of an actual device, and a specific part may be illustrated to be relatively large in order to make them easier to understand.

First Embodiment

Hereinafter, a semiconductor device according to the present embodiment will be described in detail with reference to the views.

[Structure Description]

FIG. 1 is a sectional view illustrating a configuration of the semiconductor device according to the present embodiment. The semiconductor device (semiconductor element) according to the embodiment illustrated in FIG. 1, etc., is an MIS (Metal Insulator Semiconductor) type FET (Field Effect Transistor) using a nitride semiconductor.

In the semiconductor device according to the present embodiment, a nucleation layer NUC and a buffer layer BU are sequentially formed over a substrate S.

The nucleation layer NUC includes a nitride semiconductor layer. The buffer layer BU includes one or more nitride semiconductor layers to which impurities, forming a deep level for a nitride semiconductor, are added. Herein, a superlattice structure (also referred to as a superlattice layer) including multiple nitride semiconductor layers is used.

A co-doped layer CD is formed over the buffer layer BU. The co-doped layer CD includes a nitride semiconductor layer that has impurities exhibiting a p-type and an impurities exhibiting an n-type with respect to the nitride semiconductor, respectively. The co-doped layer CD is, for example, a GaN layer containing Mg that is a p-type impurity and Si that is an n-type impurity.

The co-doped layer CD has a p-type semiconductor region CDp and an n-type semiconductor region CDn. Thus, the CDp, which will serve as a p-type semiconductor region, and the CDn, which will serve as an n-type semiconductor region, are formed in the same layer (in the same plane) (see the lower view in FIG. 2). The region that will serve as a p-type semiconductor region refers to a region where carriers are mainly holes, and the region that will serve as an n-type semiconductor region to a region where carriers are mainly electrons. The polarity (p-type or n-type) of a semiconductor region can be determined, for example, by SCM (Scanning Capacitance Microscopy), and the concentration of carriers (concentration of electrons, concentration of holes) can be determined, for example, by SMM (Scanning Microwave Microscope).

Figure 2:
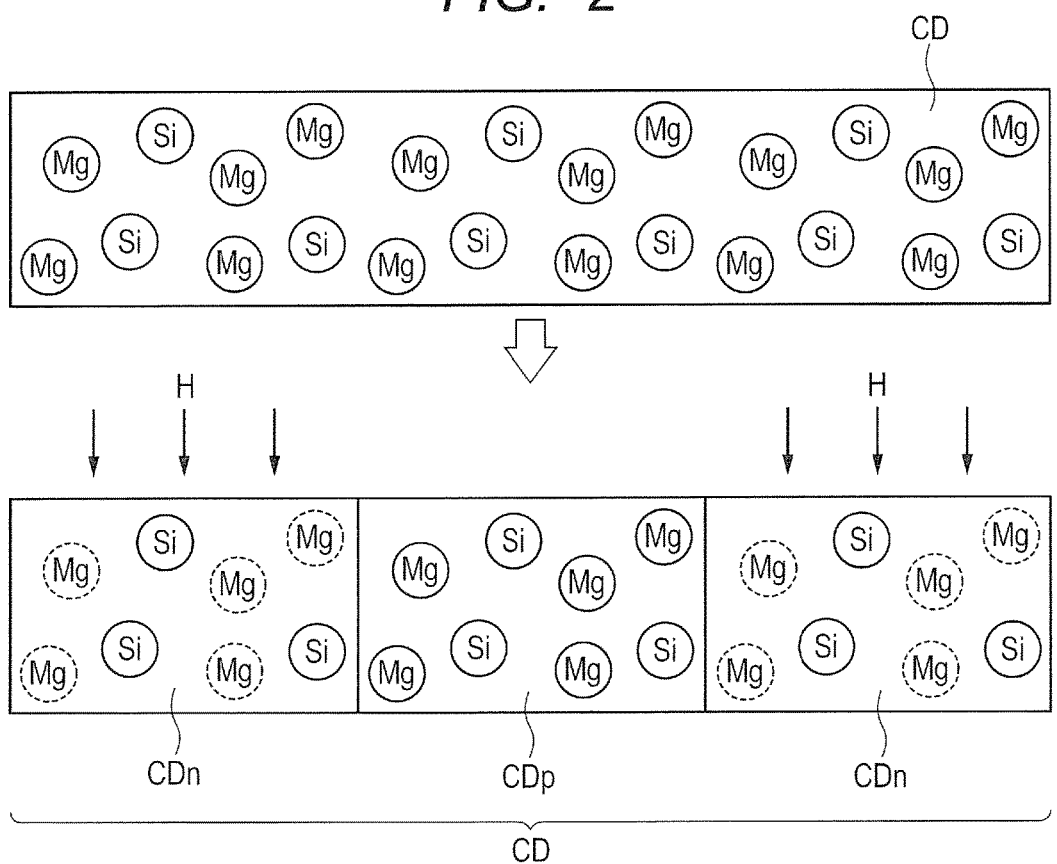
FIG. 2 is a sectional view schematically illustrating a configuration of a co-doped layer and a step of forming the co-doped layer.

FIG. 2 is a sectional view schematically illustrating a configuration of the co-doped layer and a step of forming the co-doped layer. As illustrated in the upper view of FIG. 2, the co-doped layer CD has, for example, Mg that is a p-type impurity and Si that is an n-type impurity. A nitride semiconductor layer (e.g., GaN layer) containing Mg that is a p-type impurity and Si that is an n-type impurity can be formed, for example, by epitaxially growing the nitride semiconductor layer (e.g., GaN layer) while being doped with Mg that is a p-type impurity and Si that is an n-type impurity.

Herein, the co-doped layer CD contains a larger amount of Mg that is a p-type impurity than that of Si that is an n-type impurity. In other words, the concentration of p-type impurities (herein, Mg) in the co-doped layer CD is higher than that of n-type impurities (herein, Si). Further, in other words, the content (addition amount) of p-type impurities (herein, Mg) in the co-doped layer CD is larger than that of n-type impurities (herein, Si) (Mg rich). The concentration and content of impurities can be represented, for example, by the number of impurity elements per unit volume.

Accordingly, the carriers (electrons) resulting from the n-type impurities (herein, Si) in the co-doped layer CD are canceled by the carriers (holes) resulting from the p-type impurities (herein, Mg), thereby allowing the co-doped layer CD to serve as the p-type semiconductor region (CDp).

By introducing hydrogen (H) into, of the co-doped layer CD, the region where the n-type semiconductor region is to be formed (region where the region is planned to be formed), Mg can be inactivated, as illustrated in the lower view of FIG. 2. The Mg enclosed by dashed lines in the lower view of FIG. 2 represent inactivated Mg. By inactivating Mg, the concentration of carriers (holes) resulting from the p-type impurities (herein, Mg) becomes low, for example, zero. Accordingly, in the region into which hydrogen (H) has been introduced, carriers (electrons) resulting from the n-type impurities (herein, Si) in the co-doped layer CD become dominant, and hence the region serves as the n-type semiconductor region CDn. In contrast, the region where hydrogen (H) is not introduced remains as the p-type semiconductor region CDp. A method of introducing hydrogen (H) is not limited, and an ion implantation process or a solid-phase diffusion process can be adopted, as described later.

By thus introducing hydrogen (H) into the co-doped layer CD, the p-type semiconductor region CDp and the n-type semiconductor region CDn can be formed in the same layer.

Herein, the configuration of the co-doped layer CD will be summarized.

The co-doped layer CD, prior to the introduction of hydrogen (H), has p-type impurities (herein, Mg) and n-type impurities (herein, Si). The p-type impurities (herein, Mg) and the n-type impurities (herein, Si) are almost uniformly contained in the co-doped layer CD. The concentration of the p-type impurities (herein, Mg) in the co-doped layer CD is higher (larger) than that of the n-type impurities (herein, Si). These impurities are activated.

The uniformity and concentration of each of the p-type impurities (herein, Mg) and the n-type impurities (herein, Si) in the co-doped layer CD are not changed even after the introduction of hydrogen (H). Only the activation rate of the p-type impurities (herein, Mg) is changed.

Accordingly, a co-doped layer containing p-type impurities (herein, Mg) and n-type impurities (herein, Si) is herein denoted by "CD", regardless of before and after the introduction of hydrogen (H). Accordingly, the co-doped layer CD, prior to the introduction of hydrogen (H), is a single layer having p-type impurities (herein, Mg) and n-type impurities (herein, Si), and that, after the introduction of hydrogen (H), serves as a layer having the p-type semiconductor region CDp and the n-type semiconductor region CDn (see FIG. 2).

Thus, the co-doped layer CD, after the introduction of hydrogen (H), has the p-type semiconductor region CDp and the n-type semiconductor region CDn. As described above, the polarity (p-type or n-type) of a semiconductor region can be determined, for example, by SCM. The co-doped layer CD has a region where the concentration of electrons is high and a region where the concentration of holes is high. The region where the concentration of electrons is high corresponds to the n-type semiconductor region CDn, while the region where the concentration of holes is high to the p-type semiconductor region CDp. The concentration of carriers (concentration of electrons, concentration of holes) can be determined, for example, by SMM.

The co-doped layer CD, after the introduction of hydrogen (H), has a region containing hydrogen (H) and a region not containing hydrogen (H). In other words, the co-doped layer CD has a region where the concentration of hydrogen (H) is high and a region where the concentration thereof is low. The region containing hydrogen (H) or the region where the concentration of hydrogen (H) is high corresponds to the n-type semiconductor region CDn, and the region not containing hydrogen (H) or the region where the concentration of hydrogen (H) is low corresponds to the p-type semiconductor region CDp. Accordingly, the concentration of hydrogen in the n-type semiconductor region CDn is higher than that in the p-type semiconductor region CDp. Further, in other words, the concentration of activated n-type impurities (herein, Si) in the n-type semiconductor region CDn is lower (smaller) than the concentration of activated p-type impurities (herein, Mg) in the p-type semiconductor region CDp.

The co-doped layer CD, after the introduction of hydrogen (H), has a region containing inactivated p-type impurities (herein, Mg) and a region containing activated p-type impurities (herein, Mg). The region containing inactivated p-type impurities (herein, Mg) corresponds to the n-type semiconductor region CDn, and the region containing activated p-type impurities (herein, Mg) to the p-type semiconductor region CDp. The n-type impurities (herein, Si) in the co-doped layer CD are almost uniformly present in the co-doped layer CD, in an activated state.

A MISFET according to the present embodiment has a gate electrode GE formed over the co-doped layer CD via a gate insulation film GI, as illustrated in FIG. 1. The MISFET further has a source electrode SE and a drain electrode DE they are formed above the co-doped layer CD on both sides of the gate electrode GE. Of the co-doped layer CD, the p-type semiconductor region CDp serves as a channel region. The source electrode SE and the drain electrode DE are formed over the n-type semiconductor regions CDn on both sides of the p-type semiconductor region CDp, respectively. Herein, a contact layer (impurity layer) CL is formed between the n-type semiconductor region CDn and the source electrode SE in order to reduce coupling resistance. A contact layer CL is also formed between the n-type semiconductor region CDn and the drain electrode DE in order to reduce coupling resistance. The contact layer CL includes, for example, a nitride semiconductor layer containing a high concentration of impurities. The gate electrode GE is covered with an interlayer insulation film IL. Each of the source electrode SE and the drain electrode DE is formed in a contact hole in the interlayer insulation film IL.

Subsequently, a method of introducing hydrogen (H) into, of the co-doped layer CD, the region where the p-type semiconductor region is to be formed will be described with reference to FIG. 2. A method of introducing hydrogen (H), that is, a method of inactivating Mg only in partial regions can be exemplified, for example, by the following solid-phase diffusion process and ion implantation process.

1) Solid-Phase Diffusion Process

For example, a film containing hydrogen is formed over the region where the n-type semiconductor region CDn is formed. Subsequently, hydrogen (H) is introduced from the film containing hydrogen into the co-doped layer CD by performing a heat treatment. By introducing the hydrogen (H), the activated p-type impurities (herein, Mg) are inactivated, thereby allowing the region to serve as the n-type semiconductor region CDn.

2) Ion Implantation Process

For example, a mask film, having an opening over the region where the n-type semiconductor region CDn is formed, is formed. Subsequently, by ion implanting (ion implantation) hydrogen (H) into the co-doped layer CD with the use of the mask film as a mask and then by performing a heat treatment, the p-type impurities (herein, Mg) in the co-doped layer CD are inactivated. Thereby, the region into which hydrogen (H) has been ion implanted serves as the n-type semiconductor region CDn.

The processes of the aforementioned 1) and 2) will be specifically described in the following paragraph in which a manufacturing method is described.

[Description of Manufacturing Method]

Subsequently, a manufacturing method of a semiconductor device according to the present embodiment will be described with reference to FIGS. 3 to 11, and the configuration of the semiconductor device will be made clearer. FIGS. 3 to 11 are sectional views each illustrating a manufacturing step of a semiconductor device according to the embodiment.

Figure 3:
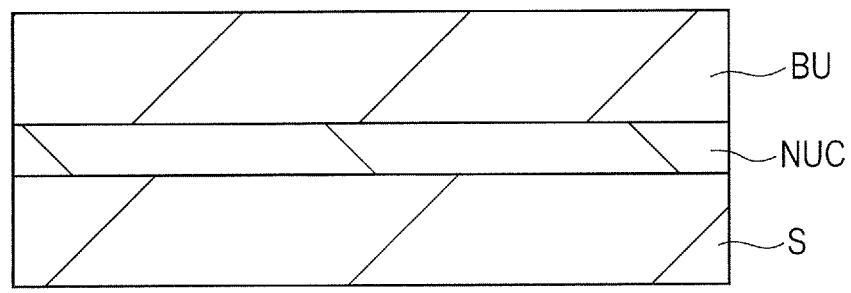
FIG. 3 is a sectional view illustrating a manufacturing step of the semiconductor device according to First Embodiment.

As illustrated in FIG. 3, the nucleation layer NUC and the buffer layer BU are sequentially formed over the substrate S. For example, a semiconductor substrate including silicon (Si) whose (111) plane is exposed is used as the substrate S, and as the nucleation layer NUC, for example, an aluminum nitride (AlN) layer is epitaxially grown to have a thickness of approximately 200 nm over the substrate by using an MOCVD (Metal Organic Chemical Vapor Deposition) process, or the like.

Alternatively, a substrate including SiC, sapphire, or the like, other than the silicon, may be used as the substrate S. A substrate including GaN may also be used, and in this case, the nucleation layer NUC may be omitted. All of the nucleation layer NUC and nitride semiconductor layers (group III-V compound semiconductor layers) that will be formed after the nucleation layer NUC are usually grown with group III element face polarity (i.e., in the present embodiment, grown with gallium-face polarity or aluminum face polarity).

Subsequently, a superlattice structure, in which laminated films (AlN/GaN films) each including a gallium nitride (GaN) layer and an aluminum nitride (AlN) layer are repeatedly laminated one over another, is formed, as the buffer layer BU, over the nucleation layer NUC. For example, gallium nitride (GaN) layers, each having a thickness of approximately 20 nm, and aluminum nitride (AlN) layers, each having a thickness of approximately 5 nm, are alternately, epitaxially grown by using an MOCVD process, or the like. The aforementioned laminated films are formed, for example, into forty layers. For example, an AlGaN layer may be epitaxially grown, as part of the buffer layer BU, over the superlattice structure by using an MOCVD process, or the like. The thickness of the AlGaN layer is, for example, approximately 1 µm. The film configuration of the buffer layer BU and the thickness of each film can be arbitrarily adjusted. For example, a single layer film not including a superlattice structure may be used as the buffer layer BU. Alternatively, the buffer layer BU may be omitted in accordance with the type of the substrate S to be used and the application of an element to be created.

GaN, AlN, InN, or a mixed crystal thereof can be used as a constituent material of the buffer layer BU. Other than the aforementioned laminated film (AlN/GaN film), for example, a superlattice structure in which AlGaN/GaN films are repeatedly laminated; a combination of the above superlattice structure and an AlGaN layer, an InAlN layer, or the like; or a single layer made of AlGaN, InAlN, or the like, can be used. Alternatively, impurities may be arbitrarily added to a film that forms the buffer layer BU. For example, a transition metal, such as Fe, C, Mg, Be, or the like, can be used as the impurities.

Figure 4:
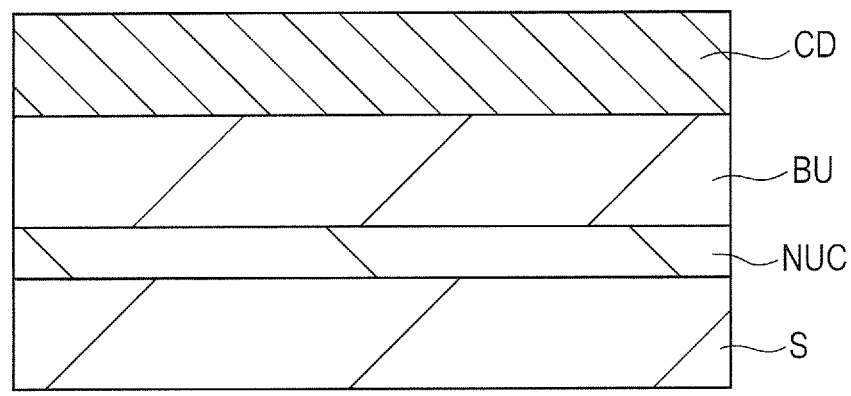
FIG. 4 is a sectional view illustrating a manufacturing step of the semiconductor device according to First Embodiment, following FIG. 3.

Subsequently, the co-doped layer CD is formed over the buffer layer BU, as illustrated in FIG. 4. A nitride semiconductor layer is first formed while being doped with p-type impurities and n-type impurities (while they are being introduced). For example, a GaN layer containing p-type impurities (herein, Mg) and n-type impurities (herein, Si) is grown by using, for example, an MOCVD process. For example, the layer is grown while carrier gas and source gas are being introduced into an apparatus. Gas containing the constituent elements of the nitride semiconductor layer (herein, GaN layer) is used as the source gas. When the GaN layer is formed, for example, trimethylgallium (TMG) and ammonia are used as source gas for Ga and N, respectively; bis(cyclopentadienyl)magnesium $((C_5H_5)_2Mg)$ is used as source gas for Mg that is a p-type impurity; and silane is used as source gas for Si that is an n-type impurity. In an epitaxial growth process, a dope amount (introduction amount) of p-type impurities and n-type impurities can be easily and accurately adjusted by adjusting the flow rate of source gas, as described above. Further, in an epitaxial growth process, a nitride semiconductor layer (herein, GaN layer) having a better characteristic, in which a lattice defect possibly caused due to the implantation of atoms is less likely to be caused, can be formed, in comparison with an ion implantation process.

For example, a GaN layer, in which the concentration (dope amount) of Mg is $5 \times 10^{18}$ $cm^{-3}$ and that of Si is $2 \times 10^{17}$ $cm^{-3}$, is grown to have a thickness of approximately 100 nm. Of course, the type and concentration of impurities for doping, and the material and thickness of the nitride semiconductor, can be arbitrarily selected in accordance with an application. As the material of the nitride semiconductor, AlN or InN can be used other than GaN. Mixed crystals of them may also be used. With respect to the impurity for doping, for example, 0, S, Se, or the like, other than Si, can be used as the n-type impurity; and for example, Zn, Be, C, or the like, other than Mg, can be used as the p-type impurity. Among them, Si and Mg can be preferably used.

Herein, it is necessary to make the concentration of the activated p-type impurities higher than that of the activated n-type impurities (concentration of the activated n-type impurities<concentration of the activated p-type impurities). It is preferable to adjust the amount of each of the p-type impurities (herein, Mg) and the n-type impurities (herein, Si) that are to be introduced into the co-doped layer CD, in view of the activation rates of them. In view of the activation rates, the concentration of the p-type impurities (herein, Mg) to be introduced into the co-doped layer CD is made larger than the concentration of the n-type impurities (herein, Si), for example, by 2 times or more, more preferably by 5 times or more, and still more preferably 10 times or more. It is also preferable to cause the concentration of the p-type impurities (herein, Mg) to be within the range of $5 \times 10^{17}$ $cm^{-3}$ to $2 \times 10^{19}$ $cm^{-3}$. Additionally, it is preferable to cause the concentration of the n-type impurities (herein, Si) to be within the range of $5 \times 10^{16}$ $cm^{-3}$ to $2 \times 10^{18}$ $cm^{-3}$. When they are within such ranges, the nitride semiconductor layer (e.g., GaN layer) can be epitaxially grown while the p-type impurities (herein, Mg) and the n-type impurities (herein, Si) are being accurately introduced into the co-doped layer CD.

Figure 5:
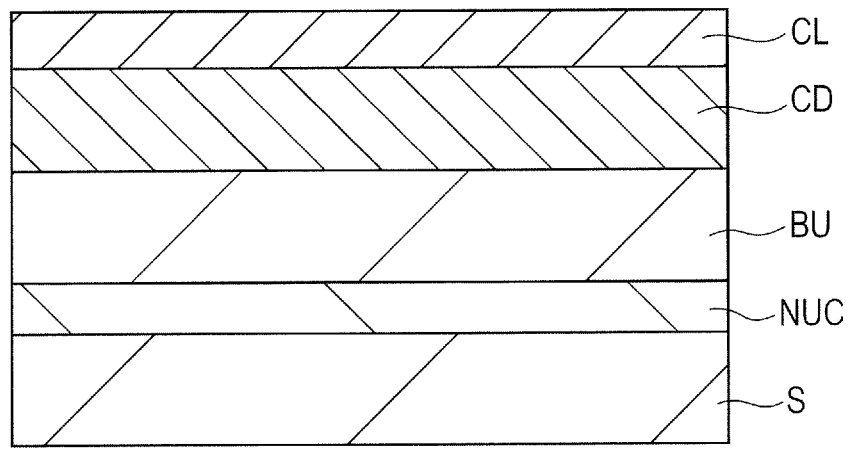
FIG. 5 is a sectional view illustrating a manufacturing step of the semiconductor device according to First Embodiment, following FIG. 4.

Subsequently, for example, a GaN layer containing n-type impurities is epitaxially grown, as the contact layer CL, over the co-doped layer CD by using an MOCVD process, or the like, as illustrated in FIG. 5. For example, Si is used as the n-type impurity. For example, a gallium nitride layer is deposited to have a thickness of approximately 50 nm, while being doped with Si. Of course, the type and concentration of impurities for doping, and the material and thickness of a nitride semiconductor, can be arbitrarily selected in accordance with an application. As the material of the nitride semiconductor, AlN or InN can be used other than GaN. Mixed crystals of them may also be used. For example, an InGaN layer, AlGaN layer, InAlN layer, or the like, can be used. With respect to the impurity for doping, for example, O, S, Se, or the like, other than Si, can be used as the n-type impurity; and, for example, Zn, Be, C, or the like, other than Mg, can be used as the p-type impurity.

Subsequently, a heat treatment, for activating the p-type impurities (herein, Mg) in the co-doped layer CD, is performed. The heat treatment is performed, for example, in a nitrogen atmosphere at 800° C. for 30 minutes. Thereby, the p-type impurities (herein, Mg) are activated. The n-type impurities (herein, Si) are easily activated, and already activated without a need of being subjected to a heat treatment.

Figure 6:
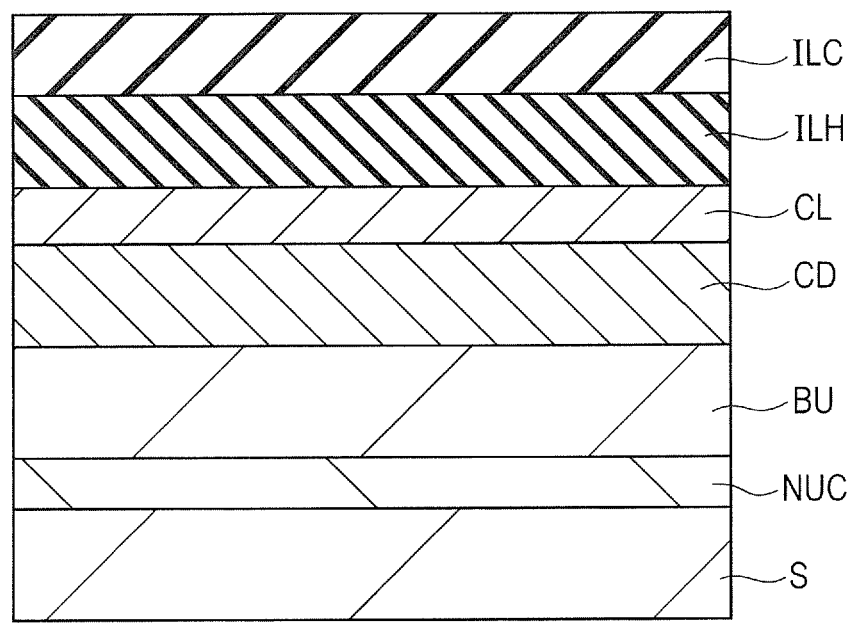
FIG. 6 is a sectional view illustrating a manufacturing step of the semiconductor device according to First Embodiment, following FIG. 5.

Subsequently, a film for introducing hydrogen (H) into the co-doped layer CD is formed, as illustrated in FIG. 6. An insulation film ILH containing a high concentration of hydrogen is formed as a hydrogen introduction film. For example, a silicon nitride film containing a high concentration of hydrogen is formed to have a thickness of approximately 100 nm by using a PECVD (plasma-enhanced chemical vapor deposition) process, or the like. Herein, a silicon nitride film (SiN film) is used as the insulation film, but a SiO2 film, SiON film, SiOC film, $Al_2O_3$ film, $HfO_2$ film, $ZrO_2$ film, or the like, can be used other than the SiN film. An organic insulation film, or the like, may also be used. In the case of an inorganic film, such as a SiN film, hydrogen is introduced into the film by using hydrogen compound gas as source gas and hydrogen as carrier gas, when the film is formed by a CVD process, or the like. When a film, containing hydrogen as a composition, is used as the organic insulation film, hydrogen can be discharged from the film. It is also preferable to use a film that can be easily removed as the insulation film ILH containing a high concentration of hydrogen.

Subsequently, a cover insulation film ILC is formed over the insulation film ILH containing a high concentration of hydrogen. For example, a silicon oxide film is formed to have a thickness of approximately 200 nm by using an atmospheric pressure CVD process, or the like. A silicon oxide film ($SiO_2$ film) is used herein as the insulation film, but other than this, a SiN film, SiON film, SiOC film, $Al_2O_3$ film, $HfO_2$ film, $ZrO_2$ film, or the like, can be used. An organic insulation film, or the like, may also be used. As the cover insulation film ILC, a film, through which hydrogen (H) is hard to pass, can be used. By thus using a film, through which hydrogen (H) is hard to pass, as the cover insulation film ILC, the amount of hydrogen (H) discharged from the upper surface side of the insulation film ILH containing a high concentration of hydrogen can be reduced, thereby allowing hydrogen (H) to be efficiently introduced into the lower surface side, i.e., into the co-doped layer CD. Additionally, it is preferable to use a film, through which hydrogen (H) is difficult to pass and which can be easily removed, as the cover insulation film ILC.

Figure 7:
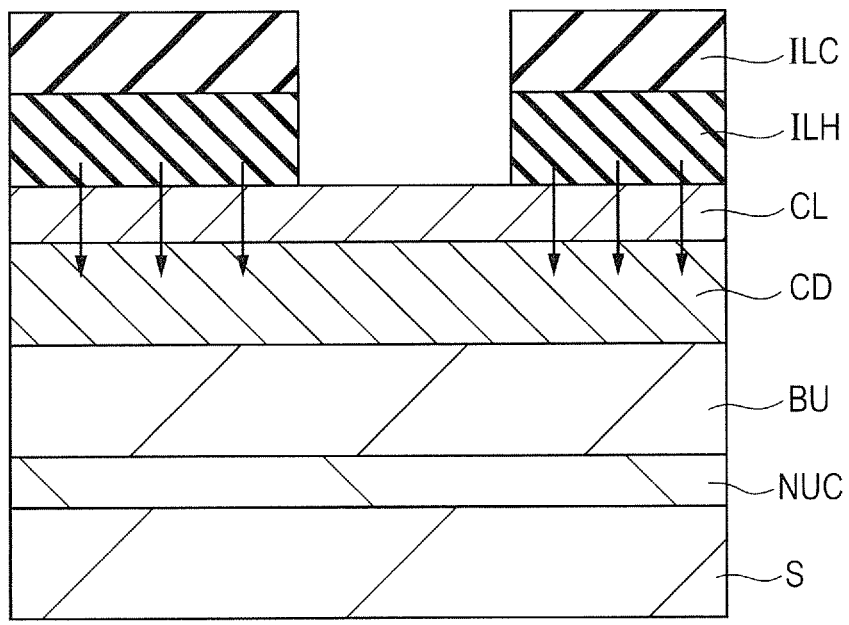
FIG. 7 is a sectional view illustrating a manufacturing step of the semiconductor device according to First Embodiment, following FIG. 6.
Figure 8:
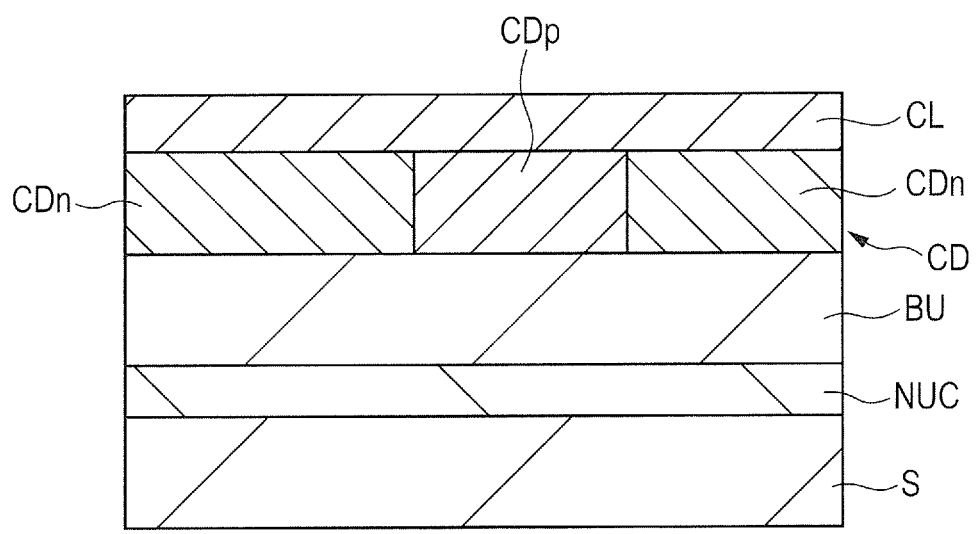
FIG. 8 is a sectional view illustrating a manufacturing step of the semiconductor device according to First Embodiment, following FIG. 7.

Subsequently, of the laminated film including the insulation film ILH containing a high concentration of hydrogen and the cover insulation film ILC, the laminated film over the region where the p-type semiconductor region CDp, which will serve as a channel layer, is to be formed is removed by using a photolithography and etching technique, as illustrated in FIG. 7. That is, a photoresist film (not illustrated) is formed over the laminated film, and the photoresist film over the region where the p-type semiconductor region CDp, which will serve as a channel layer, is to be formed is removed. Subsequently, the laminated film is removed by using the photoresist film as a mask. The laminated film is removed by dry etching using, for example, gas containing $CF_4$ as a main component. Thereafter, the photoresist film is removed. Etching a lower film by using a film having a desired shape as a mask, as described above, is referred to as patterning.

Subsequently, hydrogen (H) is introduced from the insulation film ILH containing a high concentration of hydrogen into the co-doped layer CD via the contact layer CL by performing a heat treatment. The heat treatment is performed, for example, at 600° C. for 30 minutes. Thereby, the hydrogen (H) in the insulation film ILH is diffused into the co-doped layer CD via the contact layer CL. With the introduction of hydrogen (H), the activated p-type impurities (herein, Mg) are inactivated. In this case, the n-type impurities (herein, Si) are not inactivated by hydrogen (H). Thereby, in the region into which hydrogen (H) has been introduced, Mg is inactivated, and the region serves as the n-type semiconductor region CDn (see FIGS. 8 and 2). That is, an npn constituent part can be formed, in which the p-type semiconductor region CDp, which will serve as a channel layer, and the n-type semiconductor regions CDn on both sides of the region CDp, are formed in the same layer. Herein, the contact layer (n-type GaN) CL transmits hydrogen (H). A hydrogen atom is small, and hydrogen (H) can diffuse through the layer. Hydrogen can diffuse, for example, through a nitride semiconductor layer (GaN, AlN, InN, InGaN, AlGaN, InAlN). On the other hand, a SiN film, SiON film, SiOC film, $Al_2O_3$ film, $HfO_2$ film, $ZrO_2$ film, and the like, each containing a low content of hydrogen, can prevent the diffusion of hydrogen (H).

Herein, the step of introducing hydrogen (H) into the co-doped layer CD may be performed before the contact layer (n-type GaN) CL is formed. However, all of nitride semiconductor layers are grown with group III element face polarity (i.e., in the case of this embodiment, gallium face polarity or aluminum face polarity), as described above, and hence it is preferable that a nitride semiconductor layer is formed by continuous growth. Accordingly, it is preferable to introduce hydrogen (H) into the co-doped layer CD via the contact layer CL after the contact layer CL is formed.

Thereafter, the aforementioned laminated film (ILC, ILH) is removed. The laminated film is removed, for example, by wet etching using an HF aqueous solution.

Figure 9:
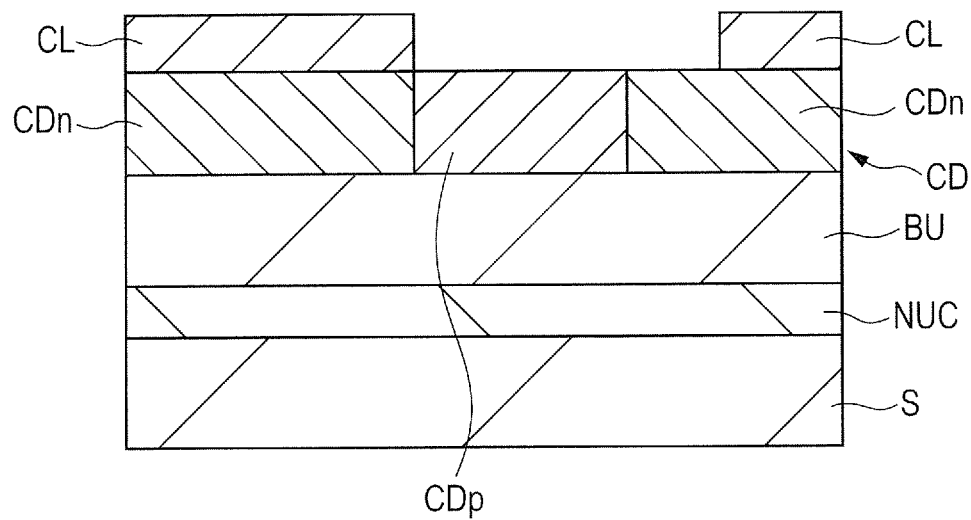
FIG. 9 is a sectional view illustrating a manufacturing step of the semiconductor device according to First Embodiment, following FIG. 8.

Subsequently, the contact layer CL over the p-type semiconductor region CDp, which will serve as a channel layer, is removed by using a photolithography and etching technique, as illustrated in FIG. 9. That is, an opening is formed by removing part of the contact layer CL. Part of the contact layer CL is removed by dry etching using, for example, gas containing $BCl_3$ as a main component. When this etching is performed, the opening is formed such that the distance between the p-type semiconductor region CDp, which will serve as a channel layer, and the contact layer CL on the side of the drain electrode DE is larger than the distance between the p-type semiconductor region CD, which will serve as a channel layer, and the contact layer CL on the side of the source electrode SE. Thereby, the distance between the channel layer (gate electrode GE) and the drain electrode DE can be secured, thereby allowing a breakdown voltage to be improved.

Figure 10:
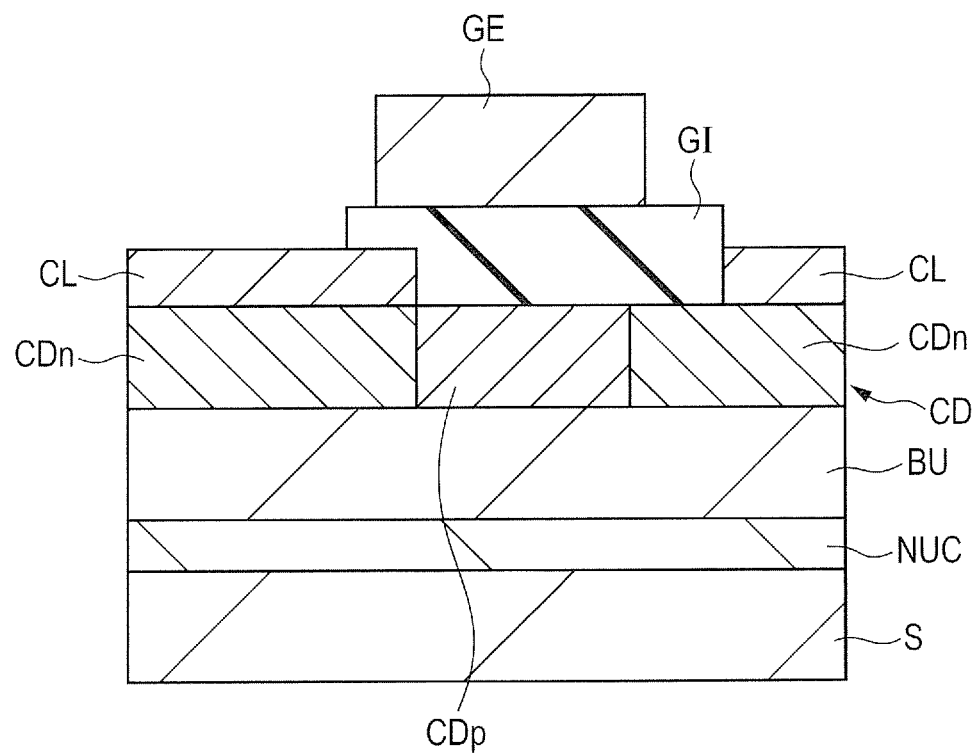
FIG. 10 is a sectional view illustrating a manufacturing step of the semiconductor device according to First Embodiment, following FIG. 9.

Subsequently, the gate electrode GE is formed in the p-type semiconductor region CDp, which will serve as a channel layer, via the gate insulation film GI, as illustrated in FIG. 10. For example, as the gate insulation film GI, an aluminum oxide film ($Al_2O_3$ film) is deposited to have a thickness of approximately 50 nm over the contact layer CL including the inside of the opening in the contact layer CL, by using an ALD (Atomic Layer Deposition) process, or the like.

As the gate insulation film GI, a silicon oxide film or a high dielectric constant film having a dielectric constant higher than that of a silicon oxide film may be used other than an aluminum oxide film. As the high dielectric constant film, a SiN film, SiON film (silicon oxynitride film), $ZrO_2$ film (zirconium oxide film), or hafnium-based insulation film (such as $HfO_2$ film (hafnium oxide film), hafnium aluminate film, HfON film (hafnium oxynitride film), HfSiO film (hafnium silicate film), HfSiON film (hafnium silicon oxynitride film), or HfAlO film) may be used. In this case, a film, having a bandgap larger than that of the outermost semiconductor layer and having an electron affinity smaller than that of the outermost semiconductor layer, is selected. Additionally, the gate insulation film GI affects a voltage that can be applied to the gate electrode GE and a threshold voltage, and hence it is necessary to design the gate insulation film GI by properly taking a breakdown voltage, dielectric constant, film thickness, and the like, into consideration.

Subsequently, as a conductive film (constituent material of the gate electrode GE), for example, a TiN (titanium nitride) film is deposited to have a thickness of approximately 200 nm over the gate insulation film GI by using a sputtering process, or the like. The constituent materials and thickness of the gate electrode GE can be arbitrarily adjusted. As the gate electrode GE, polycrystalline silicon, to which a dopant, such as B or P, has been added, may be used other than TiN. Alternatively, Ti, Al, Ni, Pt, Au, a Si compound of them, or an N compound of them, may be used. Alternatively, a multilayer film, in which films made of these materials are laminated, may be used.

Subsequently, a photoresist film (not illustrated) is formed in the region where the gate electrode is formed by using a photolithography technique, and then the gate electrode GE is formed by etching the TiN film with the use of the photoresist film as a mask. The TiN film is etched by dry etching using, for example, gas containing $Cl_2$ as a main component. Thereafter, the photoresist film is removed. Subsequently, the aluminum oxide film located under the gate electrode (TiN film) GE is etched by using another photoresist film (not illustrated) as a mask. The aluminum oxide film is etched by dry etching using, for example, gas containing $BCl_3$ as a main component. Alternatively, the gate electrode GE and the gate insulation film GI may be simultaneously processed by using the same photoresist film.

Figure 11:
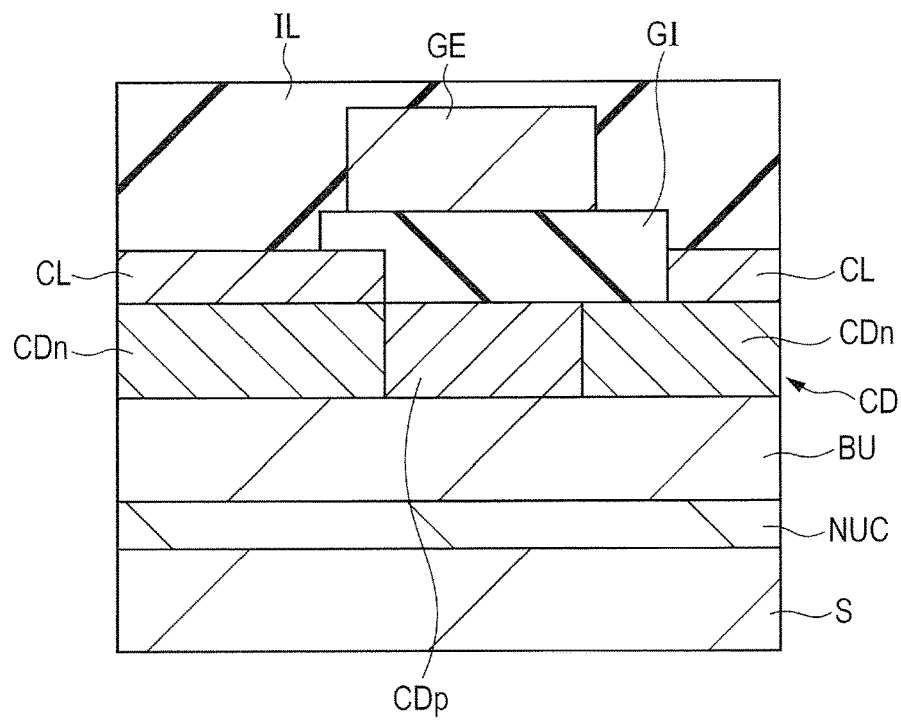
FIG. 11 is a sectional view illustrating a manufacturing step of the semiconductor device according to First Embodiment, following FIG. 10.

Subsequently, the interlayer insulation film IL is formed over the gate electrode GE and the contact layer CL, as illustrated in FIG. 11. As the interlayer insulation film IL, for example, a silicon oxide film is deposited to have a thickness of approximately 500 nm by using an atmospheric pressure CVD process, or the like. The constituent materials and thickness of the interlayer insulation film IL can be arbitrarily adjusted. As the interlayer insulation film IL, for example, a laminated film including multiple types of insulation films may be used. As the interlayer insulation film IL, a film, having a bandgap larger than that of the outermost semiconductor layer and having an electron affinity smaller than that of the outermost semiconductor layer, is preferably used. Additionally, it is preferable to use a film having a low reactivity with the materials of the gate electrode, the source electrode, and the drain electrode, etc. As the interlayer insulation film IL, for example, a SiN film (silicon nitride), SiON film (silicon oxynitride film), $Al_2O_3$ film, $ZrO_2$ film (zirconium oxide film), $HfO_2$ film (hafnium oxide film), or the like, may be used other than a silicon oxide film.

Subsequently, a contact hole is formed in the interlayer insulation film IL by using a photolithography technique and an etching technique. For example, a photoresist film (not illustrated), having an opening in each of a source electrode coupling region and a drain electrode coupling region, is formed over the interlayer insulation film IL. Subsequently, a contact hole is formed by etching the interlayer insulation film IL with the use of the photoresist film as a mask. The interlayer insulation film IL is etched by dry etching using, for example, gas containing $SF_6$ as a main component.

Subsequently, the source electrode SE and the drain electrode DE are formed in the contact hole (see FIG. 1). For example, a conductive film is formed over the interlayer insulation film IL including the inside of the contact hole. As the conductive film, for example, an Al/Ti film is formed. For example, a Ti film is formed to have a thickness of approximately 50 nm over the interlayer insulation film IL including the inside of the contact hole by using a sputtering process, or the like, and further an Al film is formed to have a thickness of approximately 1000 nm over the Ti film by using a sputtering process, or the like. Subsequently, a heat treatment is performed. The heat treatment is performed, for example, at 500° C. for 30 minutes. Thereby, an ohmic contact can be formed between the conductive film (Al/Ti film) and the lower layer.

Subsequently, a photoresist film (not illustrated) is formed in the region where the source electrode SE and the drain electrode DE are to be formed, and the conductive film (Al/Ti film) is etched by using the photoresist film (not illustrated) as a mask. The conductive film (Al/Ti film) is etched by dry etching using, for example, gas containing $Cl_2$ as a main component.

The constituent materials and thickness of the conductive film that forms the source electrode SE and the drain electrode DE can be arbitrarily adjusted. Such a conductive film is preferably formed by using a material that ohmic-contacts a nitride semiconductor layer. In particular, the contact layer CL is provided between the n-type semiconductor region CDn and the source electrode SE and between the n-type semiconductor region CDn and the drain electrode DE in the present embodiment, and hence most conductive materials can ohmic-contact. Accordingly, the material of the conductive film that forms the source electrode SE and the drain electrode DE can be selected from a wide range of materials. As the material of the conductive film that forms the source electrode SE and the drain electrode DE, for example, Ti, Al, Mo, Nb, V, a mixture (alloy) of them, a Si compound, or an N compound may be used. Alternatively, a multilayer film, in which films made of these materials are laminated, may be used.

Thereafter, an insulation film may be formed over the interlayer insulation film IL including the top portions of the source electrode SE and the drain electrode DE, and further an upper wire may be formed. Further, a protective film including an insulation film is formed over the uppermost wire.

With the aforementioned steps, the semiconductor device according to the present embodiment can be formed. Herein, the above steps are one example, and the semiconductor device according to the embodiment may be manufactured by the steps other than the above steps.

In the present embodiment, hydrogen is introduced from the insulation film ILH containing a high concentration of hydrogen into a partial region of the co-doped layer CD that is a nitride semiconductor layer containing p-type impurities and n-type impurities, as described above, and hence the p-type impurities in the region can be inactivated. Thereby, an inactivated region serves as the n-type semiconductor region CDn, while a non-inactivated region remains as the p-type semiconductor region CDp. Thus, the n-type semiconductor region CDn and the p-type semiconductor region CDp can be formed in the same layer. The impurities in these regions are arranged in ideal positions in crystals by epitaxial growth and are not implanted by using a process in which crystals are likely to be broken, such as an ion implantation, and hence good semiconductor properties can be achieved.

For example, the n-type semiconductor region CDn and the p-type semiconductor region CDp can be formed in the same layer by using an ion implantation process or a regrowth process, as described below. The merits of the present embodiment will be described in comparison with these processes.

(1) The n-type semiconductor region CDn and the p-type semiconductor region CDp can be formed in the same layer by using an ion implantation process. However, 1) in an area through which implanted atoms have passed, the crystals in the layer into which ions have implanted are broken, and hence crystallinity and the quality of a film are deteriorated. In this case, these properties are recovered to some extent by a high-temperature heat treatment at 1200° C. or higher, but not recovered perfectly; and when crystallinity and the quality of a film are intended to be maintained, ions should be implanted into a shallow portion, and hence the n-type semiconductor region CDn and the p-type semiconductor region CDp, each having a desired thickness, cannot be formed. Further, 2) in ion implantation, the control of an injection amount or injection energy is difficult, and in the current condition, for example, a semiconductor region having a relatively low concentration (e.g., n-type semiconductor region, n$^-$region, having a concentration of $1 \times 10^{18}$ cm$^{-3}$ or less). Furthermore, 3) in ion implantation, impurities that have been necessarily implanted are statistically distributed, and a region into which a small amount of ions have been implanted has high resistance, and the like, which may lead to a variation in the properties of semiconductor regions (CDn, CDp).

In contrast, in the present embodiment, 1) it is not necessary to ion implant p-type impurities (herein, Mg) and n-type impurities (herein, Si), and hence damage possibly caused by the ion implantation of these impurities can be avoided. Further, in epitaxial growth, the thickness of a film to be formed can be easily controlled, and hence films whose thicknesses range from small to large, each having a good characteristic, can be formed. Further, 2) in epitaxial growth, the concentrations of p-type impurities (herein, Mg) and n-type impurities (herein, Si) can be easily adjusted by the flow rate of source gas. Furthermore, the concentration of impurities is determined by the difference between the concentrations of p-type impurities (herein, Mg) and n-type impurities (herein, Si), and hence the concentration of impurities, ranging widely from low to high, can be easily adjusted. In particular, a region having a low concentration of impurities, which is indispensable for increasing the breakdown voltage of a semiconductor element, can be easily formed. Still furthermore, 3) in epitaxial growth, the concentration of p-type impurities (herein, Mg) and that of n-type impurities (herein, Si) can be controlled to be almost uniform, and hence a variation in the characteristic, possibly caused due to a variation in the distribution of the p-type impurities (herein, Mg) or the n-type impurities (herein, Si), can be suppressed. When the concentration of p-type impurities (herein, Mg) or n-type impurities (herein, Si) is intended to be distributed in a gradient, it can be easily achieved by adjusting the flow rate of source gas for the p-type impurities or the n-type impurities.

(2) The n-type semiconductor region CDn and the p-type semiconductor region CDp can be formed in the same layer by using a regrowth process. For example, after the n-type semiconductor region CDn is epitaxially grown, an opening is formed by removing the n-type semiconductor region CDn in the region where the p-type semiconductor region CDp is to be formed, and thereafter the p-type semiconductor region CDp is epitaxially grown (regrown) in the opening. With such a process, the n-type semiconductor region CDn and the p-type semiconductor region CDp can also be formed in the same layer. In the regrowth process, however, a plane of discontinuity of crystals is likely to be caused in an interface from which regrowth occurs, and hence a semiconductor device having a good characteristic cannot be obtained. In contrast, in the present embodiment, the laminated nitride semiconductor layer can be continuously formed; a plane of discontinuity is less likely to be caused in the interface between the layers; and the regrowth step can be avoided, thereby not causing a plane of discontinuity resulting from the regrowth step.

In the present embodiment, the n-type semiconductor region CDn and the p-type semiconductor region CDp can be accurately formed in the same layer by a simple step, as described above. Further, the characteristic of each of the formed n-type semiconductor region CDn and p-type semiconductor region CDp becomes also good.

(Application Example)

In the aforementioned manufacturing steps, a step of diffusing hydrogen (H) from a film containing a high concentration of hydrogen into the co-doped layer CD (so-called solid-phase diffusion step) has been described as an example, but hydrogen (H) may be introduced into the co-doped layer CD by an ion implantation step.

In this case, a mask film (e.g., silicon oxide film), covering the region where the p-type semiconductor region CDp, which will serve as a channel layer, is to be formed and having an opening in the region where the n-type semiconductor region CDn is to be formed, is formed, and hydrogen (H) is ion implanted into the co-doped layer CD by using the mask film as a mask, instead of the step of forming the laminated film including the insulation film ILH containing a high concentration of hydrogen and the cover insulation film ILC (see FIGS. 6 and 7). Thereafter, a heat treatment is performed such that activated p-type impurities (herein, Mg) are inactivated by hydrogen (H).

Herein, a hydrogen atom (H) is small and light, and hence it can be deeply implanted even with low energy. Further, because a hydrogen atom (H) is light and small and can be ion implanted with low energy, the ion implantation can be performed without breaking the crystals in the layer into which hydrogen atoms are implanted.

Even in the case where the n-type semiconductor region CDn and the p-type semiconductor region CDp are thus formed by an ion implantation process, the same effects can be obtained as the case they are formed by a solid-phase diffusion process.

In the present application example, hydrogen (H) is introduced directly into the co-doped layer by an ion implantation process; however, hydrogen (H) may also be ion implanted into the film over the co-doped layer and thermally diffused from the film into the co-doped layer.

Second Embodiment

In First Embodiment, a horizontal MISFET, having an npn constituent part (n-type semiconductor region CDn/p-type semiconductor region CDp/n-type semiconductor region CDn), has been described as an example, but application examples of a junction part (pn junction part) between different conductivity types formed in the same layer should not be limited the above horizontal MISFET. There are various types of semiconductor elements having pn junction parts in the same layer, but an example will be described in the present embodiment, in which the semiconductor element is applied to a vertical MISFET.

[Structure Description]

Figure 12:
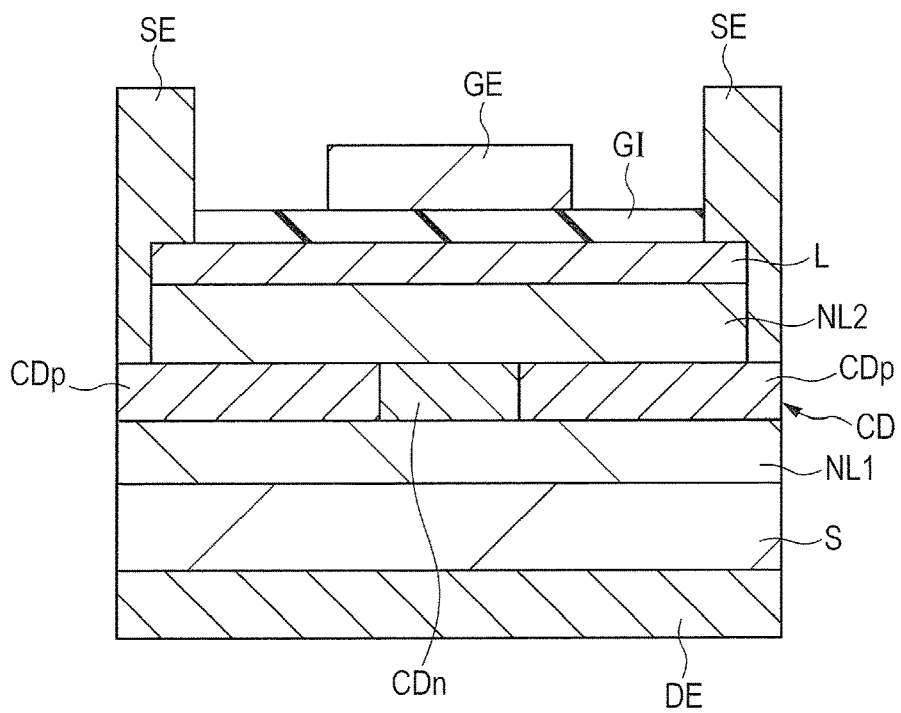
FIG. 12 is a sectional view illustrating a configuration of a semiconductor device according to Second Embodiment.

FIG. 12 is a sectional view illustrating a configuration of a semiconductor device according to the present embodiment. The semiconductor device (semiconductor element) according to the embodiment illustrated in FIG. 12 is a vertical MISFET using a nitride semiconductor.

In the semiconductor device according to the present embodiment, a first n⁻layer NL1 is formed over a substrate S. The first n⁻layer NL1 includes a nitride semiconductor layer.

A co-doped layer CD is formed over the first n⁻layer NL1. The co-doped layer CD includes a nitride semiconductor layer that has impurities exhibiting a p-type and impurities exhibiting an n-type with respect to the nitride semiconductor. The co-doped layer CD is, for example, a GaN layer containing Mg that is a p-type impurity and Si that is an n-type impurity.

The co-doped layer CD has a p-type semiconductor region CDp and an n-type semiconductor region CDn. Specifically, the co-doped layer CD has the n-type semiconductor region CDn located under a gate electrode GE and the p-type semiconductor regions CDp located on both sides of the n-type semiconductor region CDn. Thus, the CDp that will serve as a p-type semiconductor region and the CDn that will serve as an n-type semiconductor region are formed in the same layer (see the lower view of FIG. 2). The region that will serve as a p-type semiconductor region refers to a region where carriers are mainly holes, and the region that will serve as an n-type semiconductor region to a region where carriers are mainly electrons. The polarity (p-type or n-type) of a semiconductor region can be determined, for example, by SCM, and the concentration of carriers (concentration of electrons, concentration of holes) can be determined, for example, by SMM.

Herein, the co-doped layer CD contains a larger amount of Mg that is a p-type impurity than that of Si that is an n-type impurity, similarly to First Embodiment. In other words, the concentration of p-type impurities (herein, Mg) in the co-doped layer CD is higher than that of n-type impurities (herein, Si). Accordingly, the carriers (electrons) resulting from the n-type impurities (herein, Si) in the co-doped layer CD are canceled by the carriers (holes) resulting from the p-type impurities (herein, Mg), thereby allowing the co-doped layer CD to serve as a p-type semiconductor region.

By introducing hydrogen (H) into, of the co-doped layer CD, the region where the n-type semiconductor region is to be formed, Mg can be inactivated (see FIG. 2). By inactivating Mg, the concentration of carriers (holes) resulting from the p-type impurities (herein, Mg) becomes low, for example, zero. Accordingly, in the region into which hydrogen (H) has been introduced, carriers (electrons) resulting from the n-type impurities (herein, Si) in the co-doped layer CD become dominant, and hence the region serves as the n-type semiconductor region CDn. A process for introducing hydrogen (H) is not limited, but an ion implantation process or a solid-phase diffusion process can be used, as described in First Embodiment.

A second n⁻layer (also referred to as a carrier traveling layer) NL2 is formed over the co-doped layer CD. The second n⁻layer NL2 includes a nitride semiconductor layer. A barrier layer L is formed over the second n⁻layer NL2. The barrier layer L includes a nitride semiconductor layer. Two source electrodes SE, which will be described later, are formed on both sides of the laminated film including the second n⁻layer NL2 and the barrier layer L. The source electrode SE is electrically coupled to the p-type semiconductor region CDp.

The gate electrode GE is formed over the barrier layer L via a gate insulation film GI. The two source electrodes SE are formed on both sides of the gate electrode GE, respectively. That is, the source electrode SE is formed over the p-type semiconductor region CDp so as to contact the sidewall of the laminated film including the second n⁻layer NL2 and the barrier layer L. A drain electrode DE is formed over the rear surface of the substrate S.

In the vertical MISFET illustrated in FIG. 12, electrons flow from the source electrode SE to the drain electrode DE via the n-type semiconductor region CDn in the co-doped layer CD, when a potential is applied to the gate electrode GE.

By thus introducing hydrogen (H) into the co-doped layer CD, the p-type semiconductor region CDp and the n-type semiconductor region CDn can be formed in the same layer.

[Description of Manufacturing Method]

Subsequently, a manufacturing method of the semiconductor device according to the present embodiment will be described with reference to FIGS. 13 to 16, and the configuration of the semiconductor device will be made clearer. FIGS. 13 to 16 are sectional views each illustrating a manufacturing step of the semiconductor device according to the embodiment.

Figure 13:
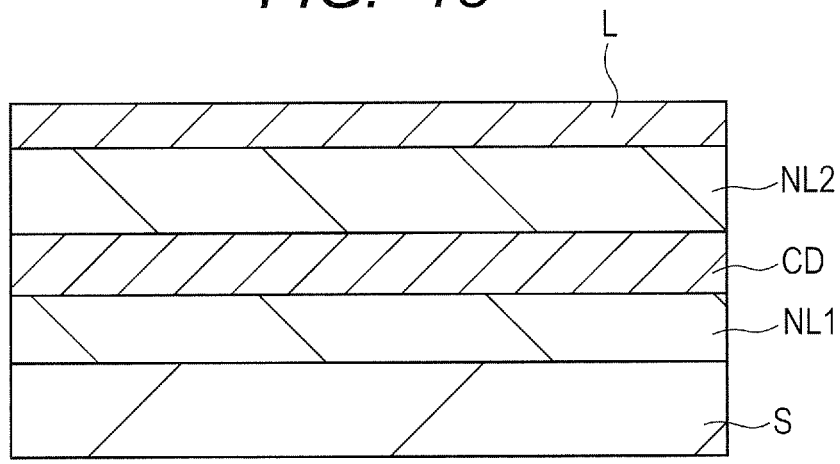
FIG. 13 is a sectional view illustrating a manufacturing step of the semiconductor device according to Second Embodiment.

As illustrated in FIG. 13, the first n⁻layer NL1, the co-doped layer CD, the second n⁻layer NL2, and the barrier layer L are sequentially formed over the substrate S. These layers include a nitride semiconductor layer.

A semiconductor substrate including GaN that contains n-type impurities (n⁺GaN substrate) is used as the substrate S, and for example, a GaN layer containing n-type impurities is epitaxially grown, as the first n⁻layer NL1, over the substrate S by using an MOCVD process, or the like. A gallium nitride layer is deposited to have a thickness of approximately 3 μm, while being doped, for example, with Si as the n-type impurity. The concentration of Si in the deposited film is set, for example, to approximately $1 \times 10^{16}$ (1E16) cm$^{-3}$. All of the first n⁻layer NL1 and the nitride semiconductor layers (group III-V compound semiconductor layers) formed thereafter are usually grown with group III element face polarity (i.e., in the present embodiment, gallium face polarity or aluminum face polarity).

Subsequently, the co-doped layer CD is formed over the first n⁻layer NL1. A nitride semiconductor layer is first formed while being doped with p-type impurities and n-type impurities (while they are being introduced). For example, a GaN layer containing p-type impurities (herein, Mg) and n-type impurities (herein, Si) is grown by using, for example, an MOCVD process. For example, the layer is grown while carrier gas and source gas are being introduced into an apparatus. As the carrier gas, hydrogen, nitrogen, or mixed gas thereof is used. As the source gas, gas containing the constituent elements of the nitride semiconductor layer (herein, GaN layer) or gas containing the constituent elements of the p-type impurities and the n-type impurities, is used, similarly to First Embodiment.

For example, a GaN layer, in which the concentration (dope amount) of Mg is $1\times10^{18}$ cm$^{-3}$ and that of Si is $1\times10^{16}$ cm$^{-3}$, is grown to have a thickness of approximately 500 nm. Of course, the type and concentration of impurities for doping, and the material and thickness of the nitride semiconductor, can be arbitrarily selected in accordance with an application. As the material of the nitride semiconductor, AlN or InN can be used other than GaN. Mixed crystals of them may also be used. With respect to the impurity for doping, for example, S, Se, or the like, other than Si, can be used as the n-type impurity; and for example, Be, C, or the like, other than Mg, can be used as the p-type impurity. Among them, Si and Mg can be preferably used.

Herein, it is necessary to make the concentration of the activated p-type impurities higher than that of the activated n-type impurities (concentration of the activated n-type impurities<concentration of the activated p-type impurities). It is preferable to adjust the amount of each of the p-type impurities (herein, Mg) and the n-type impurities (herein, Si) that are to be introduced into the co-doped layer CD, in view of the activation rates of them.

Subsequently, for example, a GaN layer containing n-type impurities is epitaxially grown, as the second n⁻layer NL2, over the co-doped layer CD by using an MOCVD process, or the like. For example, the gallium nitride layer is deposited to have a thickness of approximately 50 nm, while being doped with Si as the n-type impurity. The concentration of Si in the deposited film is set, for example, to approximately $1\times10^{16}$ (1E16) cm$^{-3}$.

Subsequently, for example, an AlGaN layer is epitaxially grown, as the barrier layer L, over the second n⁻layer NL2 by using an MOCVD process, or the like. For example, an AlGaN layer having an Al composition ratio of 0.2 is deposited to have a thickness of approximately 20 nm.

Subsequently, a heat treatment, for activating the p-type impurities (herein, Mg) in the co-doped layer CD, is performed. The heat treatment is performed, for example, in a nitrogen atmosphere at 800° C. for 30 minutes. Thereby, the p-type impurities (herein, Mg) are activated. Herein, the n-type impurities (herein, Si) are easily activated, and already activated without a need of being subjected to a heat treatment.

Figure 14:
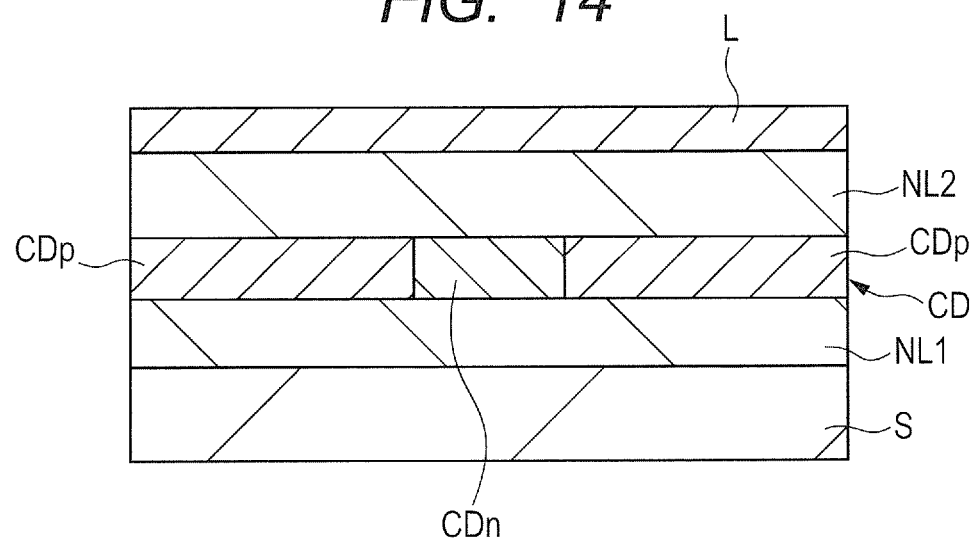
FIG. 14 is a sectional view illustrating a manufacturing step of the semiconductor device according to Second Embodiment, following FIG. 13.

Subsequently, a laminated film (not illustrated, see FIG. 7) including an insulation film ILH containing a high concentration of hydrogen and a cover insulation film ILC is formed over the region where the n-type semiconductor region CDn is to be formed. The laminated film can be formed similarly to First Embodiment. Subsequently, hydrogen (H) is introduced into the co-doped layer CD by performing a heat treatment. With the introduction of the hydrogen (H), the activated p-type impurities (herein, Mg) are inactivated, thereby allowing the region to serve as the n-type semiconductor region CDn (FIG. 14). Alternatively, hydrogen (H) may be introduced into the co-doped layer CD by using an ion implantation process, as described in First Embodiment.

Figure 15:
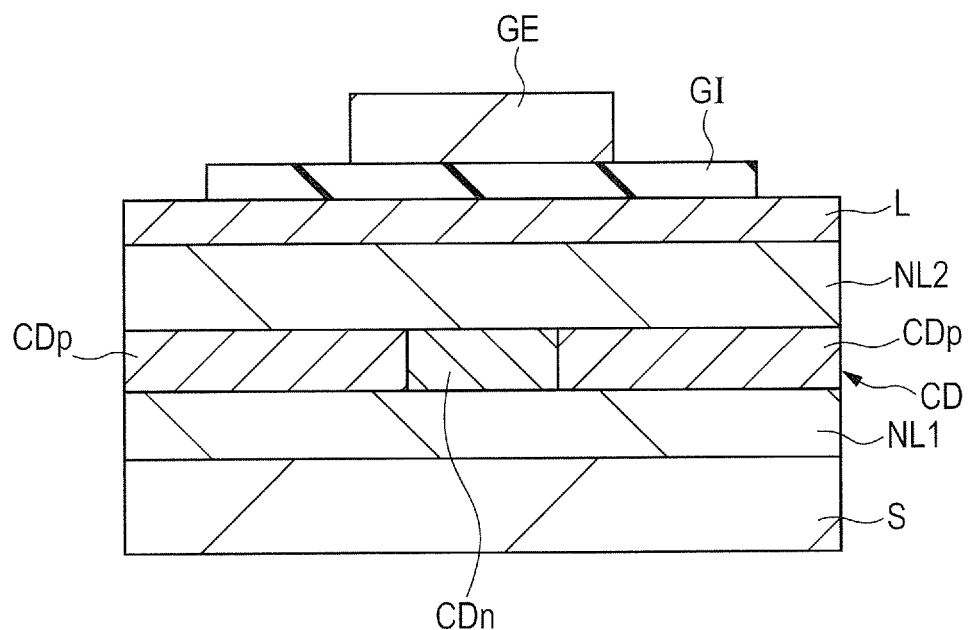
FIG. 15 is a sectional view illustrating a manufacturing step of the semiconductor device according to Second Embodiment, following FIG. 14.
Figure 16:
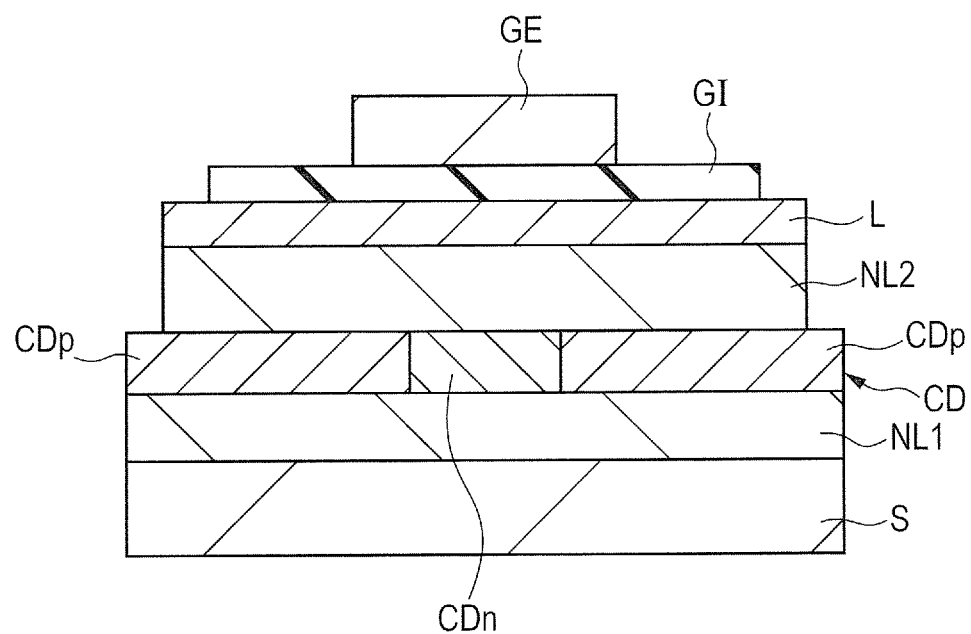
FIG. 16 is a sectional view illustrating a manufacturing step of the semiconductor device according to Second Embodiment, following FIG. 15.

Subsequently, the gate electrode GE is formed over a barrier layer L above the n-type semiconductor region CDn via a gate insulation film GI, as illustrated in FIG. 15. The gate insulation film GI and the gate electrode GE can be formed, for example, in the same way as that in First Embodiment. Subsequently, the second n⁻layer NL2 and the barrier layer L are patterned (FIG. 16).

Subsequently, the two source electrodes SE are formed on both sides of the gate electrode GE, and further a drain electrode DE is formed over the rear surface of the substrate S (see FIG. 12). These electrodes can be formed by forming conductive films and by patterning them. Alternatively, the source electrode SE may be formed after an interlayer insulation film is formed over the gate electrode GE.

With the aforementioned steps, the semiconductor device according to the present embodiment can be formed. Herein, the above steps are one example, and the semiconductor device according to the embodiment may be manufactured by the steps other than the above steps.

Also in the present embodiment, by thus introducing hydrogen from an insulation film containing a high concentration of hydrogen into a partial region of the co-doped layer CD, which is a nitride semiconductor layer containing p-type impurities and n-type impurities, the p-type impurities in the region can be inactivated. Thereby, the inactivated region serves as the n-type semiconductor region CDn, while a non-inactivated region remains as the p-type semiconductor region CDp. Thus, the n-type semiconductor region CDn and the p-type semiconductor region CDp can be formed in the same layer. The impurities in these regions are arranged in ideal positions in crystals by epitaxial growth and are not implanted by using a process in which crystals are likely to be broken, such as an ion implantation, and hence good semiconductor properties can be achieved. Further, as described in First Embodiment, various merits can be exhibited in comparison with the case where the n-type semiconductor region CDn and the p-type semiconductor region CDp are formed in the same layer by using an ion implantation process or a regrowth process.

Further, in the semiconductor device according to the present embodiment, a higher breakdown voltage can be achieved with the first n⁻layer NL1 and the co-doped layer CD. For example, with the first n⁻layer NL1 having a thickness of 3 μm and the co-doped layer CD having a thickness of 500 nm, the breakdown voltage of the semiconductor device can be ensured to be 900 V or higher, assuming that the theoretical breakdown voltage of GaN is 3 MV/cm. Thereby, the distance between the source electrode SE and the gate electrode GE can be reduced, thereby allowing the area of the semiconductor element to be reduced.

Third Embodiment

In the present embodiment, an example will be described, in which a junction part (pn junction part) between different conductivity types formed in the same layer is applied to a superjunction structure part in a power MISFET.

[Structure Description]

Figure 17:
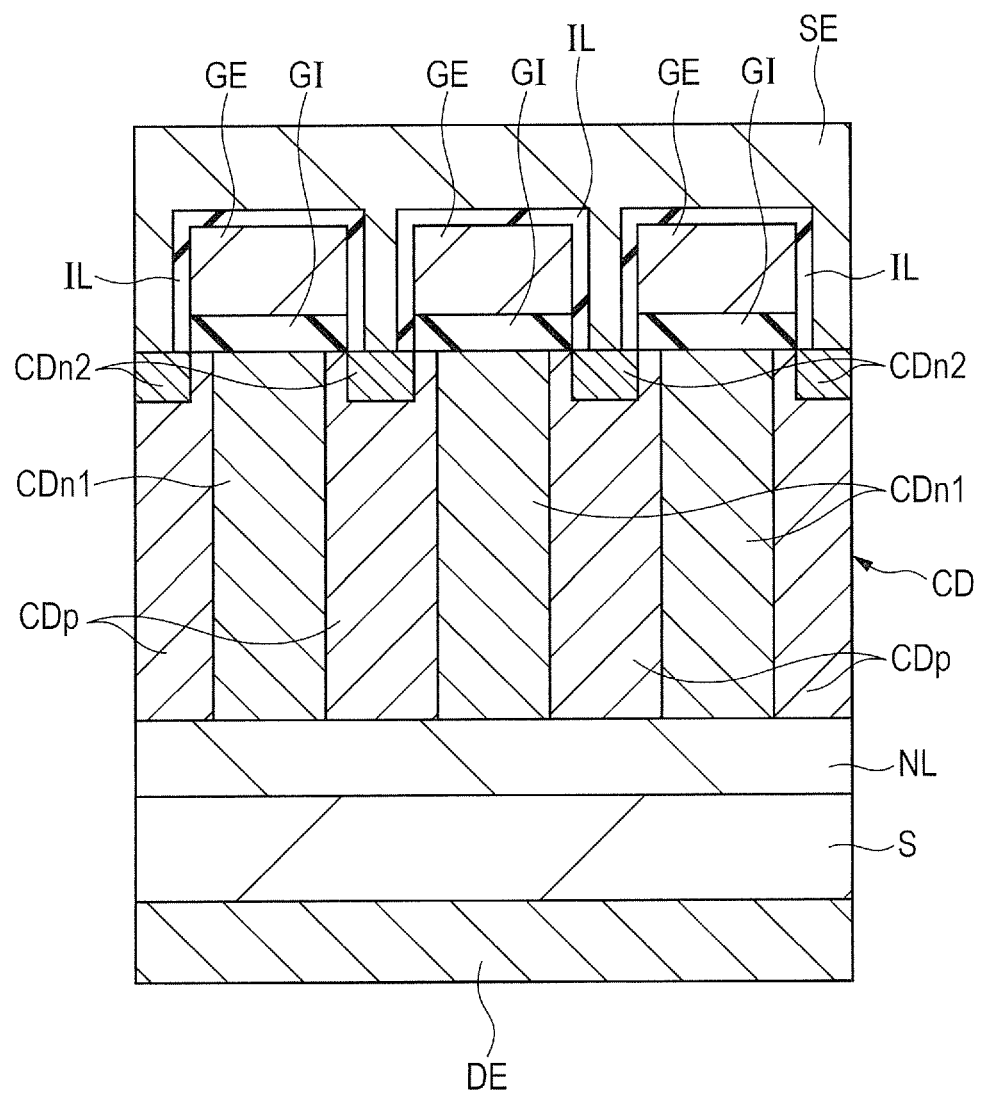
FIG. 17 is a sectional view illustrating a configuration of a semiconductor device according to Third Embodiment.

FIG. 17 is a sectional view illustrating a configuration of a semiconductor device according to the present embodiment. The semiconductor device (semiconductor element)

according to the embodiment is a vertical power MISFET adopting a superjunction structure.

In the semiconductor device according to the present embodiment, an n⁻layer NL is formed over a substrate S. The n⁻layer NL includes a nitride semiconductor layer.

A co-doped layer CD is formed over the n⁻layer NL. The co-doped layer CD includes a nitride semiconductor layer that has impurities exhibiting a p-type and impurities exhibiting an n-type with respect to the nitride semiconductor, respectively. The co-doped layer CD is, for example, a GaN layer containing Mg that is a p-type impurity and Si that is an n-type impurity. The thickness of the co-doped layer CD is, for example, approximately 5 μm.

The co-doped layer CD has a p-type semiconductor region CDp and n-type semiconductor regions CDn1 and CDn2. Specifically, the co-doped layer CD has the n-type semiconductor region CDn1 located under the gate electrode GE, and the p-type semiconductor regions CDp located on both sides of the n-type semiconductor region CDn1. The co-doped layer CD also has the n-type semiconductor region CDn2 located between the gate electrodes GE. The CDp that will serve as a p-type semiconductor region and the CDn1 and CDn2 that will serve as an n-type semiconductor region are thus formed in the same layer. The region that will serve as a p-type semiconductor region refers to a region where carriers are mainly holes, and the region that will serve as an n-type semiconductor to a region where carriers are mainly electrons. The polarity (p-type or n-type) of a semiconductor region can be determined, for example, by SCM, and the concentration of carriers (concentration of electrons, concentration of holes) can be determined, for example, by SMM.

Herein, the co-doped layer CD contains a larger amount of Mg that is a p-type impurity than that of Si that is an n-type impurity, similarly to First Embodiment. In other words, the concentration of p-type impurities (herein, Mg) in the co-doped layer CD is higher than that of n-type impurities (herein, Si). Accordingly, the carriers (electrons) resulting from the n-type impurities (herein, Si) in the co-doped layer CD prior to the introduction of H are canceled by the carriers (holes) resulting from the p-type impurities (herein, Mg), thereby allowing the co-doped layer CD to serve as the p-type semiconductor region (CDp).

Herein, the co-doped layer CD has a plurality of the p-type semiconductor regions (also referred to as p-type column regions or p-type pillars) CDp and a plurality of the n-type semiconductor regions (also referred to as n-type column regions or n-type pillars) CDn1. The p-type semiconductor regions CDp and the n-type semiconductor regions CDn1 are alternately arranged. Such a structure, in which the p-type semiconductor regions CDp and the n-type semiconductor regions CDn are periodically arranged, is referred to as a superjunction structure (SJ constituent part). With such a structure, a depletion layer extends laterally from a boundary area between the p-type semiconductor region CDp and the n-type semiconductor region CDn1, i.e., from a pn junction that extends longitudinally, and hence a breakdown voltage can be secured.

The power MISFET has the gate electrode GE arranged over the n-type semiconductor region CDn1 via a gate insulation film GI. For example, a silicon oxide film can be used as the gate insulation film GI. As described above, the n-type semiconductor region CDn2 is formed between the gate electrodes GE.

The gate electrode GE is covered with an interlayer insulation film IL. The source electrode SE is formed over the n-type semiconductor region CDn2, and a drain electrode DE is formed over the rear surface of the substrate S.

Also in the present embodiment, the p-type semiconductor region CDp and the n-type semiconductor regions CDn1 and CDn2 can be thus formed in the same layer by introducing hydrogen (H) into the co-doped layer CD.

[Description of Manufacturing Method]

Subsequently, a manufacturing method of the semiconductor device according to the present embodiment will be described with reference to FIGS. 18 to 23, and the configuration of the semiconductor device will be made clearer. FIGS. 18 to 23 are sectional views each illustrating a manufacturing step of the semiconductor device according to the embodiment.

Figure 18:
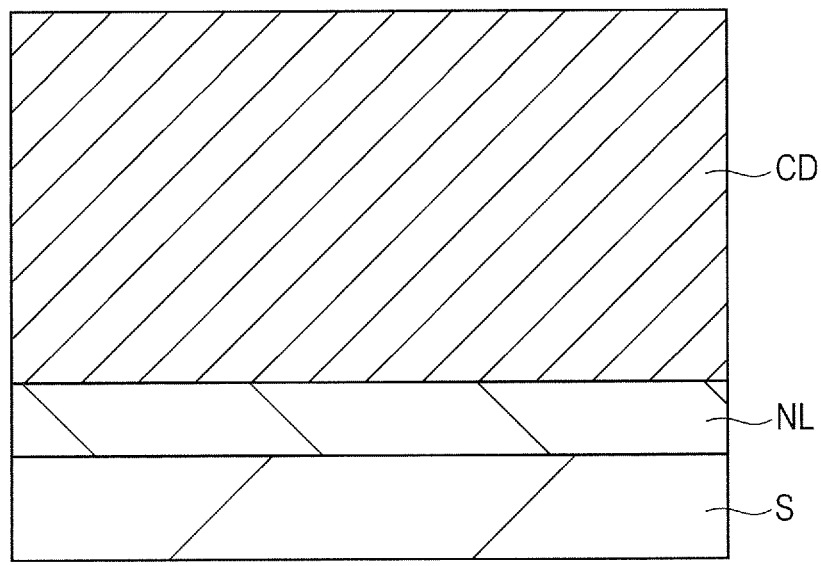
FIG. 18 is a sectional view illustrating a manufacturing step of the semiconductor device according to Third Embodiment.

As illustrated in FIG. 18, the n⁻layer NL and the co-doped layer CD are sequentially formed over the substrate S. These layers include a nitride semiconductor layer.

For example, a semiconductor substrate (n⁺GaN substrate) including GaN that contains n-type impurities is used as the substrate S, and for example, a GaN layer containing n-type impurities is epitaxially grown, as the n⁻layer NL, over the substrate S by using an MOCVD process, or the like. For example, a gallium nitride layer is deposited while being doped with Si as the n-type impurity. All of the n⁻layer NL and the nitride semiconductor layers (group III-V compound semiconductor layers) formed thereafter are usually grown with group III element face polarity (i.e., in the present embodiment, gallium face polarity or aluminum face polarity).

Subsequently, the co-doped layer CD is formed over the n⁻layer NL. A nitride semiconductor layer is first formed while being doped with p-type impurities and n-type impurities (while they are being introduced). For example, a GaN layer containing p-type impurities (herein, Mg) and n-type impurities (herein, Si) is grown by using, for example, an MOCVD process. For example, the layer is grown while carrier gas and source gas are being introduced into an apparatus. As the source gas, gas containing the constituent elements of the nitride semiconductor layer (herein, GaN layer) or gas containing the constituent elements of the p-type impurities and the n-type impurities, is used, similarly to First Embodiment.

For example, a GaN layer, in which the concentration (dope amount) of Mg is $1 \times 10^{18}$ cm⁻³ and that of Si is $1 \times 10^{16}$ cm⁻³, is grown to have a thickness of approximately 5 μm. Of course, the type and concentration of impurities for doping, and the material and thickness of the nitride semiconductor, can be arbitrarily selected in accordance with an application. As the material of the nitride semiconductor, AlN or InN can be used other than GaN. Mixed crystals of them may also be used. With respect to the impurity for doping, for example, S, Se, or the like, other than Si, can be used as the n-type impurity; and for example, Be, C, or the like, other than Mg, can bee used as the p-type impurity. Among them, Si and Mg can be preferably used.

Herein, it is necessary to make the concentration of the activated p-type impurities higher than that of the activated n-type impurities (concentration of the activated n-type impurities<concentration of the activated p-type impurities). It is preferable to adjust the amount of each of the p-type impurities (herein, Mg) and the n-type impurities (herein, Si) that are to be introduced into the co-doped layer CD, in view of the activation rates of them.

Subsequently, a heat treatment, for activating the p-type impurities (herein, Mg) in the co-doped layer CD, is performed. The heat treatment is performed, for example, in a nitrogen atmosphere at 800° C. for 30 minutes. Thereby, the p-type impurities (herein, Mg) are activated. The n-type impurities (herein, Si) are easily activated, and already activated without a need of being subjected to a heat treatment.

Figure 19:
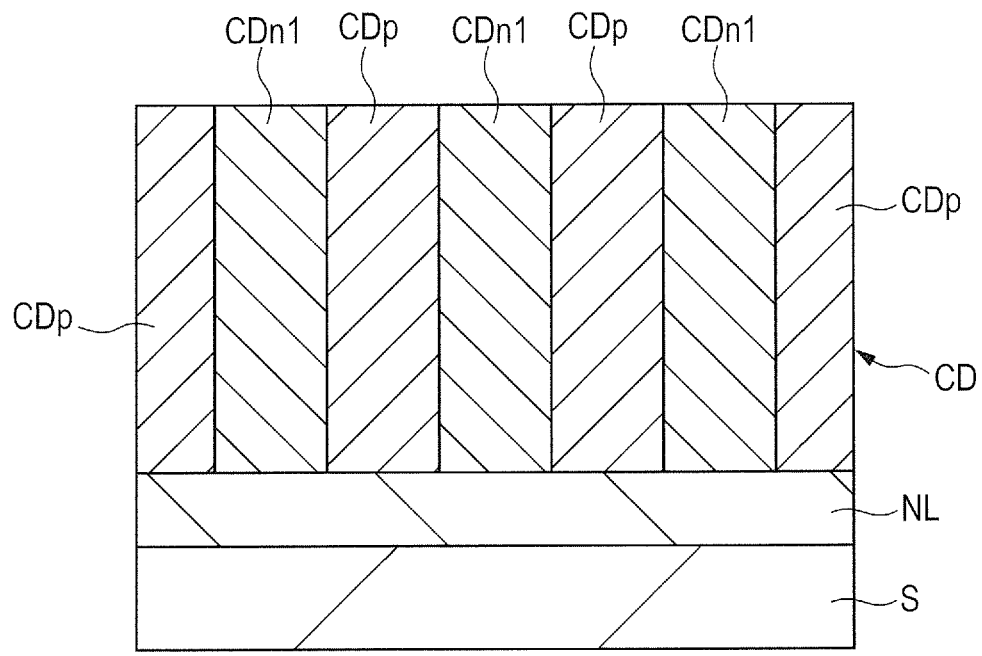
FIG. 19 is a sectional view illustrating a manufacturing step of the semiconductor device according to Third Embodiment, following FIG. 18.

Subsequently, a laminated film (not illustrated, see FIG. 7) including an insulation film containing a high concentration of hydrogen and a cover insulation film is formed over a region where the n-type semiconductor region CDn is to be formed. The laminated film can be formed similarly to First Embodiment. Subsequently, hydrogen (H) is introduced into the co-doped layer CD by performing a heat treatment. With the introduction of the hydrogen (H), the activated p-type impurities (herein, Mg) are inactivated, thereby allowing the region to serve as the n-type semiconductor region CDn (FIG. 19). Alternatively, hydrogen (H) may be introduced into the co-doped layer CD by using an ion implantation process, as described in First Embodiment.

Figure 20:
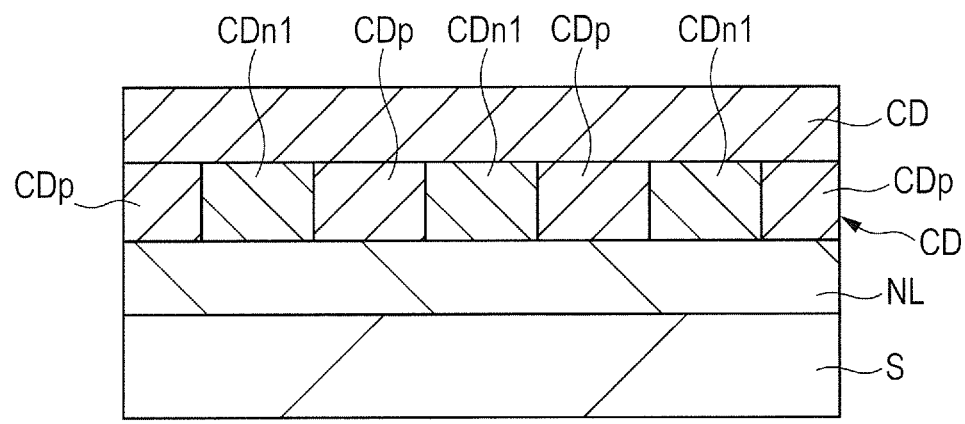
FIG. 20 is a sectional view illustrating another manufacturing step of the semiconductor device according to Third Embodiment.

When the thickness of the co-doped layer CD is large, the step of introducing hydrogen (H) may be performed in multiple times (e.g., 2 times). As illustrated in FIG. 20, for example, a GaN layer is grown to have a thickness of approximately 2.5 μm such that hydrogen (H) is introduced from an insulation film (not illustrated) containing a high concentration of hydrogen, and further a GaN layer (CD) is grown to have a thickness of approximately 2.5 μm such that hydrogen (H) is introduced from an insulation film (not illustrated) containing a high concentration of hydrogen (see FIG. 19).

Figure 21:
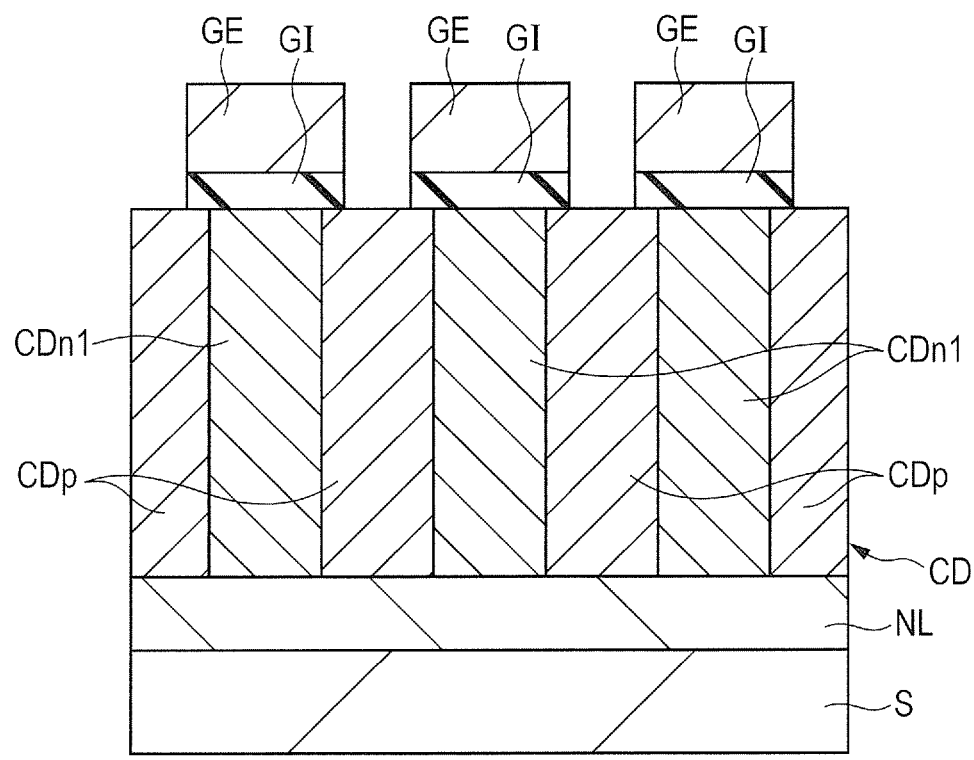
FIG. 21 is a sectional view illustrating a manufacturing step of the semiconductor device according to Third Embodiment, following FIG. 19.

Subsequently, the gate electrode GE is formed over the n-type semiconductor region CDn1 via the gate insulation film GI, as illustrated in FIG. 21. The gate insulation film GI and the gate electrode GE can be formed, for example, in the same way as that in First Embodiment.

Figure 22:
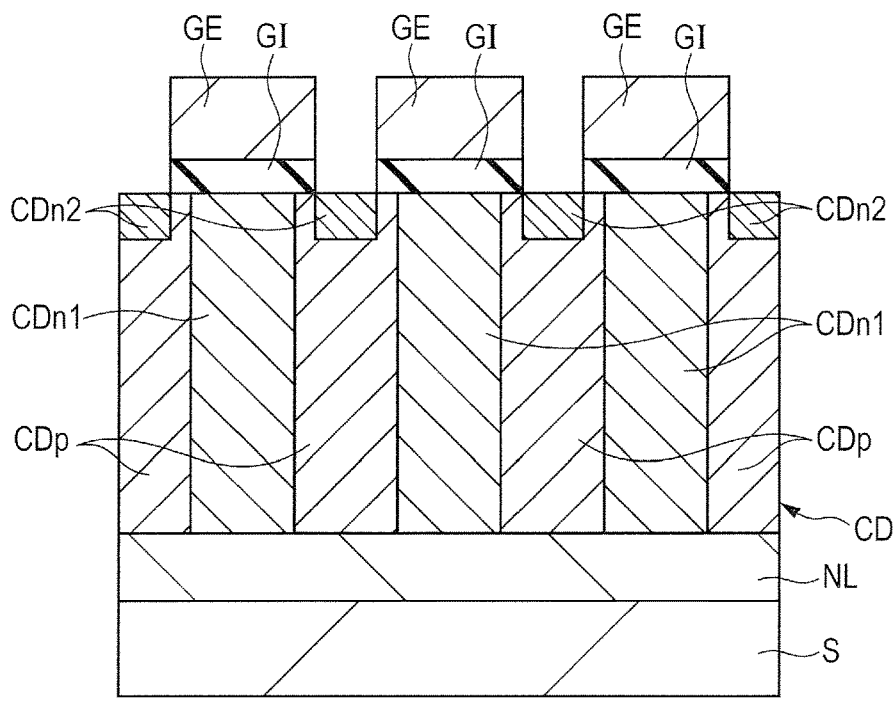
FIG. 22 is a sectional view illustrating a manufacturing step of the semiconductor device according to Third Embodiment, following FIG. 21.

Subsequently, hydrogen (H) is ion implanted between the gate electrodes GE by using the gate electrode GE as a mask, as illustrated in FIG. 22. Thereafter, the activated p-type impurities (herein, Mg) are inactivated by hydrogen (H) emerging due to a heat treatment, and the n-type semiconductor region CDn2 is formed between the gate electrodes GE and in the upper portion of the p-type semiconductor region CDp.

Figure 23:
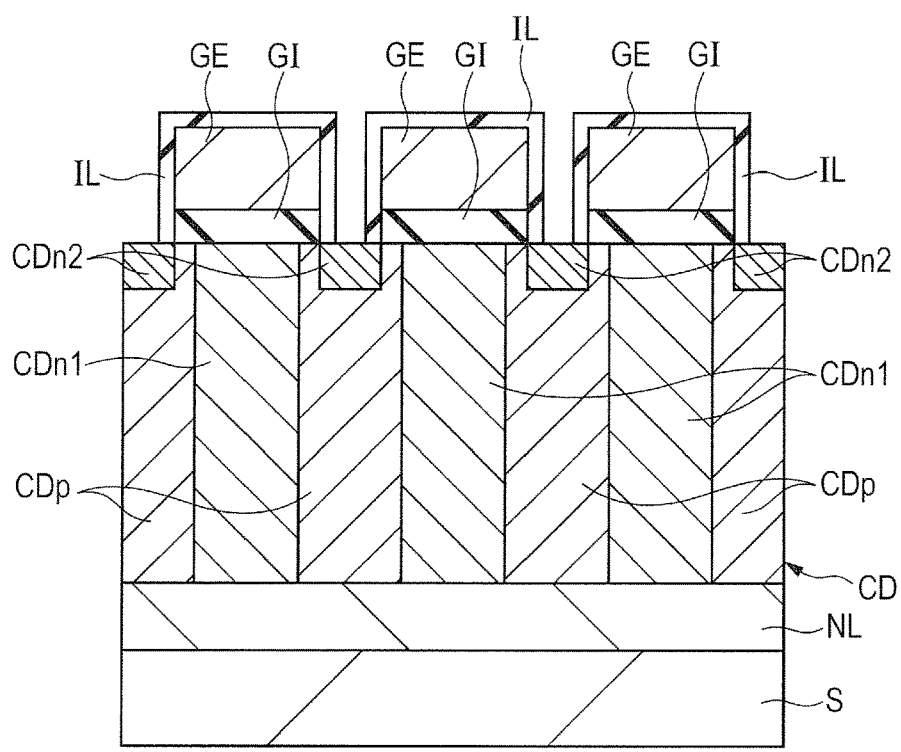
FIG. 23 is a sectional view illustrating a manufacturing step of the semiconductor device according to Third Embodiment, following FIG. 22.

Subsequently, the interlayer insulation film IL is formed over the gate electrode GE, and an opening is then formed by removing the interlayer insulation film IL over the n-type semiconductor region CDn2, as illustrated in FIG. 23. Subsequently, a conductive film is deposited over the interlayer insulation film IL including the inside of the opening and the conductive film is patterned, thereby allowing the source electrode SE to be formed. Subsequently, the drain electrode DE is formed over the rear surface of the substrate S (see FIG. 17).

With the aforementioned steps, the semiconductor device according to the present embodiment can be formed. The above steps are one example, and the semiconductor device according to the embodiment may be manufactured by the steps other than the above steps.

Also in the present embodiment, by thus introducing hydrogen into a partial region of the co-doped layer CD, which is a nitride semiconductor layer containing p-type impurities and n-type impurities, the p-type impurities in the region can be inactivated. Thereby, the inactivated regions serve as the n-type semiconductor regions CDn1 and CDn2, and the non-inactivated region remains as the p-type semiconductor region CDp, and hence the n-type semiconductor regions CDn1 and CDn2 and the p-type semiconductor region CDp can be formed in the same layer. The impurities in these regions are arranged in ideal positions in crystals by epitaxial growth and are not implanted by using a process in which crystals are likely to be broken, such as an ion implantation, and hence good semiconductor properties can be achieved. Further, various merits can be exhibited in comparison with the case where the n-type semiconductor regions and the p-type semiconductor region are formed in the same layer by using an ion implantation process or a regrowth process, as described in First Embodiment.

In the aforementioned steps, the n-type semiconductor region CDn1 is formed by a solid-phase diffusion process and the n-type semiconductor region CDn2 is formed by an ion implantation process; however, the n-type semiconductor region CDn1 may be formed by an ion implantation process and the n-type semiconductor region CDn2 may be formed by a solid-phase diffusion process. Alternatively, both the n-type semiconductor regions CDn1 and CDn2 may be formed by a solid-phase diffusion process or an ion implantation process.

The invention made by the present inventors has been specifically described above based on preferred embodiments; however, it is needless to say that the invention should not be limited to the preferred embodiments and various modifications may be made to the invention within a range not departing from the gist of the invention.

A MISFET has been mainly described as an example, for example, in the aforementioned First to Third Embodiments, but there are various types of semiconductor elements having pn junction parts in the same layer. Such pn junction parts can be applied to various semiconductor devices, such as power electronics devices, high-frequency amplification devices, circuits for switching power supplies or inverters, etc., power modules, and high-frequency amplifiers.

What is claimed is:

1. A manufacturing method of a semiconductor device, comprising the steps of:
    (a) forming, over a substrate, a nitride semiconductor layer containing p-type impurities and n-type impurities; and
    (b) introducing hydrogen into a first region of the nitride semiconductor layer,
    wherein the first region is allowed to serve as an n-type semiconductor region by the step (b),
    wherein in the nitride semiconductor layer, a concentration of the p-type impurities is higher than a concentration of the n-type impurities.

2. The manufacturing method of a semiconductor device according to claim 1,
    wherein the step (b) is a step in which hydrogen is diffused from a film, which is formed over the first region and contains hydrogen, into the first region by performing a heat treatment.

3. The manufacturing method of a semiconductor device according to claim 1,
    wherein the step (b) includes the steps of:
    (b1) ion implanting hydrogen by using a film having an opening in the first region as a mask; and
    (b2) after the step (b1), performing a heat treatment.

4. The manufacturing method of a semiconductor device according to claim 1,
    wherein in the step (b), hydrogen is not introduced into a second region of the nitride semiconductor layer, and the second region is a p-type semiconductor region.

5. The manufacturing method of a semiconductor device according to claim 1, comprising the step of:
    (c) forming a gate electrode over the nitride semiconductor layer via a gate insulation film.

6. The manufacturing method of a semiconductor device according to claim 1,
wherein the p-type impurity is Mg and the n-type impurity is Si.

* * * * *